United States Patent
Lee et al.

(10) Patent No.: US 10,971,585 B2
(45) Date of Patent: Apr. 6, 2021

(54) GATE SPACER AND INNER SPACER FORMATION FOR NANOSHEET TRANSISTORS HAVING RELATIVELY SMALL SPACE BETWEEN ADJACENT GATES

(71) Applicant: International Business Machines Corporation, Armonk, NY (US)

(72) Inventors: Choonghyun Lee, Rensselaer, NY (US); Injo Ok, Loudonville, NY (US); Soon-cheon Seo, Glenmont, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/969,855

(22) Filed: May 3, 2018

(65) Prior Publication Data

US 2019/0341450 A1     Nov. 7, 2019

(51) Int. Cl.
*H01L 29/06*      (2006.01)
*H01L 29/423*     (2006.01)
(Continued)

(52) U.S. Cl.
CPC .... *H01L 29/0673* (2013.01); *H01L 21/02532* (2013.01); *H01L 21/02603* (2013.01);
(Continued)

(58) Field of Classification Search
CPC ......... H01L 21/02293; H01L 21/02381; H01L 21/02603; H01L 25/071; H01L 29/0673;
(Continued)

(56) References Cited

U.S. PATENT DOCUMENTS 7,700,419 B2    4/2010   Anwar et al.
8,080,456 B2    12/2011   Barwicz et al.
(Continued)

OTHER PUBLICATIONS

Anonymous, "Improved Spacer for Nano Sheet Transistors," IPCOM000244655D, Jan. 2016, 5 pages.
(Continued)

*Primary Examiner* — Matthew L Reames
(74) *Attorney, Agent, or Firm* — Cantor Colburn LLP; Douglas Pearson

(57) ABSTRACT

Embodiments of the invention are directed to a nano sheet semiconductor device fabrication method that includes forming a gate spacer along a gate region of the nanosheet FET device. Channel nanosheet is formed such that each one has a desired final channel nanosheet width dimension (Wf). An inner spacer is formed between the channel nanosheets. Forming the gate spacer and the inner spacer includes, subsequent to forming the channel nanosheets to the desired Wf, conformally depositing a layer of the spacer material along a sidewall of the gate region, along sidewalls of the channel nanosheets, and within a space between the channel nanosheets. The gate spacer is formed from a portion of the layer of the spacer material along the sidewall of the gate region. The inner spacer is formed from a portion of the layer of the spacer material within the space between the channel nanosheets.

18 Claims, 17 Drawing Sheets

(51) Int. Cl.
*H01L 29/66* (2006.01)
*H01L 21/762* (2006.01)
*H01L 21/02* (2006.01)
*H01L 27/088* (2006.01)
*H01L 21/8234* (2006.01)
*H01L 21/306* (2006.01)

(52) U.S. Cl.
CPC ...... *H01L 21/30604* (2013.01); *H01L 21/762* (2013.01); *H01L 21/823431* (2013.01); *H01L 27/0886* (2013.01); *H01L 29/068* (2013.01); *H01L 29/0653* (2013.01); *H01L 29/42392* (2013.01); *H01L 29/6653* (2013.01); *H01L 29/66545* (2013.01); *H01L 29/66553* (2013.01); *H01L 29/66795* (2013.01)

(58) Field of Classification Search
CPC ............. H01L 29/068; H01L 29/42392; H01L 29/6653; H01L 29/66545; H01L 29/66553; H01L 29/66795; H01L 21/762; H01L 21/02532; H01L 27/0886; H01L 21/823431; H01L 21/30604
See application file for complete search history.

(56) References Cited

U.S. PATENT DOCUMENTS

| | | |
|---|---|---|
| 8,389,416 B2 | 3/2013 | Luong |
| 8,472,239 B2 | 6/2013 | Chang et al. |
| 8,809,131 B2 | 8/2014 | Bangsaruntip et al. |
| 9,362,355 B1 | 6/2016 | Cheng et al. |
| 9,461,114 B2 | 10/2016 | Obradovic et al. |
| 9,484,447 B2 | 11/2016 | Kim et al. |
| 9,620,590 B1 | 4/2017 | Bergendahl et al. |
| 9,647,139 B2 | 5/2017 | Doris et al. |
| 9,660,028 B1 | 5/2017 | Cheng et al. |
| 9,799,748 B1 | 10/2017 | Xie et al. |
| 9,859,368 B2 | 1/2018 | Kim et al. |
| 9,881,998 B1 | 1/2018 | Cheng et al. |
| 9,923,055 B1 | 3/2018 | Cheng et al. |
| 2008/0135949 A1 | 6/2008 | Lo et al. |
| 2012/0007051 A1 | 1/2012 | Bangsaruntip et al. |
| 2012/0138886 A1 | 6/2012 | Kuhn et al. |
| 2014/0339611 A1 | 11/2014 | Leobandung |
| 2016/0020305 A1 | 1/2016 | Obradovic et al. |
| 2016/0071729 A1 | 3/2016 | Hatcher et al. |
| 2016/0126310 A1 | 5/2016 | Rodder et al. |
| 2016/0365411 A1 | 12/2016 | Yeh et al. |
| 2017/0047452 A1 | 2/2017 | Kim et al. |
| 2017/0069481 A1 | 3/2017 | Doris et al. |
| 2017/0200738 A1 | 7/2017 | Kim et al. |
| 2017/0213905 A1 | 7/2017 | Lee et al. |
| 2017/0221992 A1 | 8/2017 | Chang et al. |
| 2017/0263704 A1 | 9/2017 | Kittl et al. |
| 2017/0317169 A1 | 11/2017 | Bentley et al. |
| 2017/0330934 A1* | 11/2017 | Zhang ................ H01L 29/0665 |
| 2017/0365604 A1* | 12/2017 | Suh .................... H01L 27/0924 |
| 2019/0006485 A1 | 1/2019 | Kim et al. |

OTHER PUBLICATIONS

Bi et al., "Gate Spacer and Inner Spacer Formation for Nanosheet Transistors Having Relatively Small Space Between Gates," U.S. Appl. No. 15/944,322, filed Apr. 3, 2018.

Cheng et al., "Inner Spacer for Nanosheet Transistors," U.S. Appl. No. 15/826,841, filed Nov. 30, 2017.

List of IBM Patents or Patent Applications Treated as Related; Date Filed: May 3, 2018, 2 pages.

Bi et al., "Gate Spacer and Inner Spacer Formation for Nanosheet Transistors Having Relatively Small Space Between Gates," U.S. Appl. No. 16/515,759, filed Jul. 18, 2019.

List of IBM Patents or Patent Applications Treated As Related; Date Filed: Jul. 18, 2019, 2 pages.

Bi et al., "Gate Spacer and Inner Spacer Formation for Nanosheet Transistors Having Relatively Small Space Between Gates," U.S. Appl. No. 16/739,265, filed Jan. 10, 2020.

List of IBM Patents or Patent Applications Treated As Related; Date Filed: Mar. 13, 2020, 2 pages.

\* cited by examiner

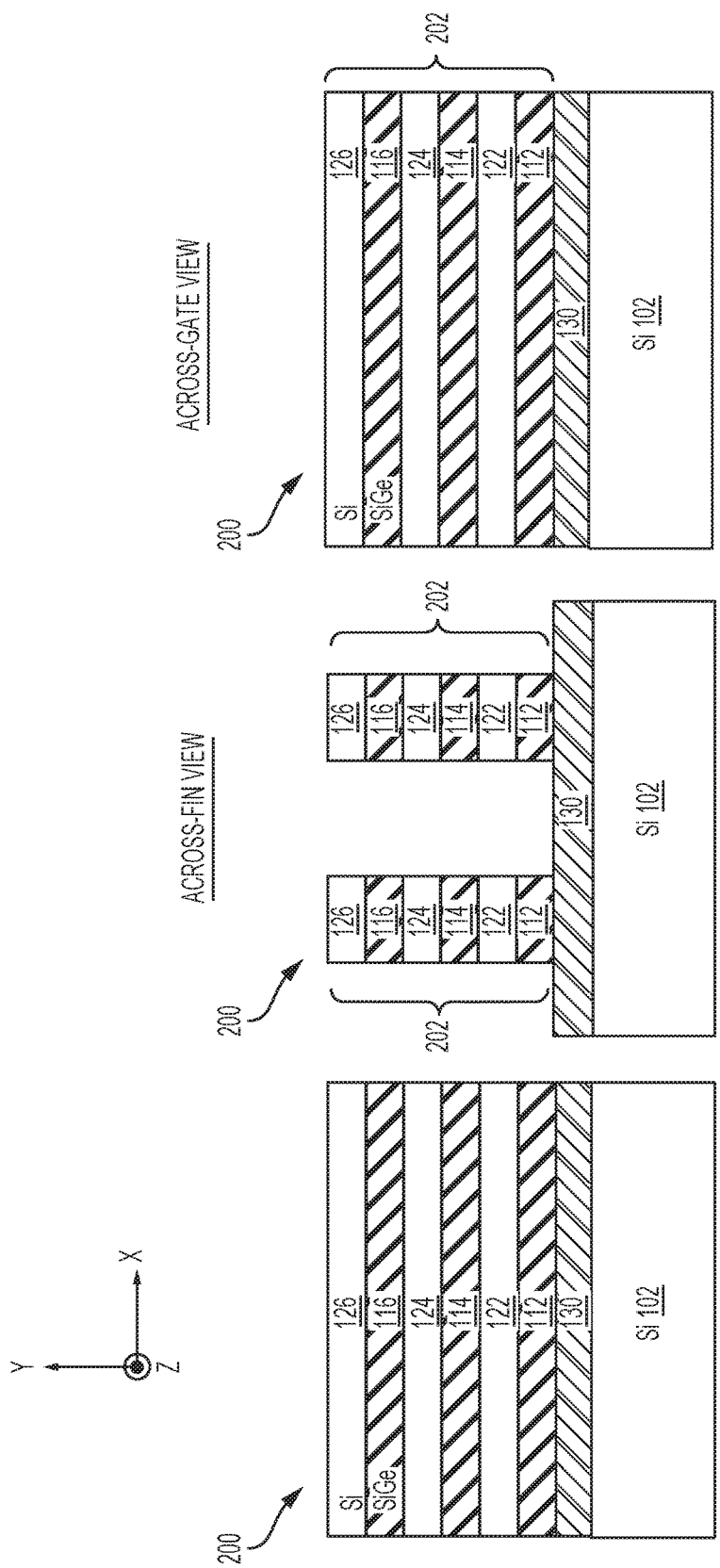

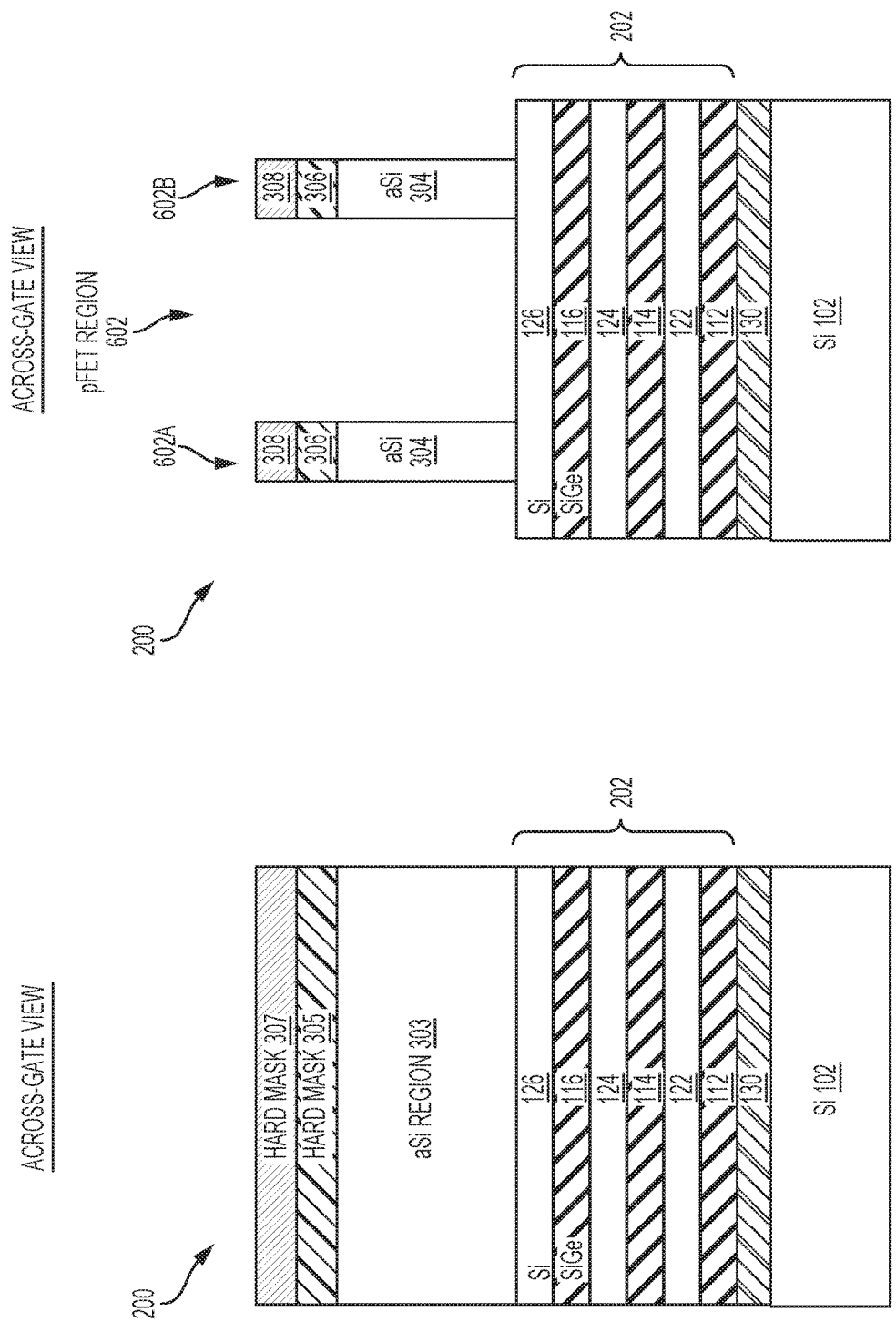

GATE SPACER AND INNER SPACER FORMATION FOR NANOSHEET TRANSISTORS HAVING RELATIVELY SMALL SPACE BETWEEN ADJACENT GATES

BACKGROUND

The present invention relates in general to fabrication methods and resulting structures for semiconductor devices. More specifically, the present invention relates to fabrication methods and resulting structures for forming the offset gate spacers (or outer spacers) and the inner spacers in sub-44 nm CPP (contacted poly/gate pitch) nanosheet transistors, wherein a relatively small amount of space (e.g., below about 10 nm) is available between the gates of adjacent nanosheet transistors during fabrication steps.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased channel density and performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method of fabricating a semiconductor device. A non-limiting example of the method includes performing fabrication operations to form a nanosheet field effect transistor (FET) device on a substrate. The fabrication operations include forming a gate spacer along a gate region of the nanosheet FET device. Channel nanosheets are formed to a desired final channel nanosheet width dimension (Wf) for each of the channel nanosheets. An inner spacer is formed between the channel nanosheets. The gate spacer and the inner spacer are formed from the same type of spacer material. Forming the gate spacer and the inner spacer includes, subsequent to forming the channel nanosheets to the desired Wf, conformally depositing a layer of the spacer material to extend along a sidewall of the gate region, sidewalls of the channel nanosheets, and within a space between the channel nanosheets. The gate spacer is formed from a portion of the layer of the spacer material that is along the sidewall of the gate region. The inner spacer is formed from a portion of the layer of the spacer material that is within the space between the channel nanosheets.

Embodiments of the invention are directed to a method of fabricating adjacent semiconductor devices. A non-limiting example of the method includes performing fabrication operations to form a first nanosheet FET device and a second nanosheet FET on a substrate. The fabrication operations to form the first nanosheet FET include forming a first gate spacer along a first gate region of the first nano sheet FET device; forming first channel nanosheets to a desired first final channel nanosheet width dimension (F-Wf) for each of the first channel nano sheets; and forming a first inner spacer between the first channel nanosheets. The fabrication operations to form the second nanosheet FET include forming a second gate spacer along a second gate region of the second nanosheet FET device; forming second channel nanosheets to a desired second final channel nanosheet width dimension (S-Wf) for each of the second channel nanosheets; and forming a second inner spacer between the second channel nanosheets. The first gate spacer, the second gate spacer, the first inner spacer, and the second inner spacer are formed from the same type of spacer material. Forming the first gate spacer, the second gate spacer, the first inner spacer, and the second inner spacer includes, subsequent to forming the first channel nanosheets to the F-Wf and forming the second channel nanosheets to the S-Wf, conformally depositing a layer of the spacer material to extend along a sidewall of the first gate region, a sidewall of the second gate region, sidewalls of the first channel nanosheets, sidewalls of the second channel nanosheets, within a space between the first channel nanosheets, and within a space between the second channel nanosheets. The first gate spacer is formed from a portion of the layer of the spacer material that is along the sidewall of the first gate region. The first inner spacer is formed from a portion of the layer of the spacer material that is within the space between the first channel nanosheets. The second gate spacer is formed from a portion of the layer of the spacer material that is along the sidewall of the second gate region. The second inner spacer is formed from a portion of the layer of the spacer material that is within the space between the second channel nanosheets.

Embodiments of the invention are directed to a semiconductor structure. A non-limiting example of the semiconductor structure includes a first nanosheet FET device and a second nanosheet FET formed on a substrate. The first nanosheet FET includes a first gate spacer formed along a first gate region of the first nanosheet FET device; first channel nanosheets each having a desired first final channel nanosheet width dimension (F-Wf); and a first inner spacer between the first channel nanosheets. The second nanosheet FET includes a second gate spacer formed along a second gate region of the second nanosheet FET device; second channel nanosheets each having a desired second final channel nanosheet width dimension (S-Wf); and forming a second inner spacer between the second channel nanosheets. The first gate spacer, the second gate spacer, the first inner spacer, and the second inner spacer are formed from the same type of spacer material. A gate pitch from the first gate region to the second gate region is equal to or less than about 44 nm. A space between the first gate region and the second gate region, wherein the gate regions include the gate spacer and the inner spacer, is less than about 10 nm due to process variabilities, e.g. gate width, overlay, gate line edge roughness, gate pitch variation, and so on. In some embodiments of the invention, the above-described space between first and second gate regions is between 0 nm and about 10 nm due to process variabilities, e.g. gate width, overlay, gate line edge roughness, gate pitch variation, and so on.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-19 depict cross-sectional views of a section of a substrate/wafer after various fabrication operations to form adjacent nanosheet transistors thereon, wherein the adjacent nanosheet transistors include offset gate spacers (or outer spacers) and inner spacers according to embodiments of the invention, in which:

FIG. 2 depicts a cross-sectional view of a semiconductor structure after initial fabrication stages according to embodiments of the invention;

FIG. 3A depicts a cross-sectional, across-the-fin view of the semiconductor structure after fabrication stages according to embodiments of the invention;

FIG. 3B depicts a cross-sectional, across-the-gate view of the semiconductor structure shown in FIG. 3A, wherein the across-the-gate view results from rotating the across-the-fin view 90 degrees counterclockwise into the page;

FIG. 4 depicts a cross-sectional, across-the gate view of the semiconductor structure after fabrication stages according to embodiments of the invention;

FIG. 5 depicts a cross-sectional, across-the gate view of the semiconductor structure after fabrication stages according to embodiments of the invention;

FIG. 6 depicts a cross-sectional, across-the gate view of the semiconductor structure after fabrication stages according to embodiments of the invention;

FIG. 7 depicts a cross-sectional, across-the gate view of the semiconductor structure after fabrication stages according to embodiments of the invention;

FIG. 8 depicts a cross-sectional, across-the gate view of the semiconductor structure after fabrication stages according to embodiments of the invention;

FIG. 9 depicts a cross-sectional, across-the gate view of the semiconductor structure after fabrication stages according to embodiments of the invention;

FIG. 10 depicts a cross-sectional, across-the gate view of the semiconductor structure after fabrication stages according to embodiments of the invention;

FIG. 11 depicts a cross-sectional, across-the gate view of the semiconductor structure after fabrication stages according to embodiments of the invention;

FIG. 12 depicts a cross-sectional, across-the gate view of the semiconductor structure after fabrication stages according to embodiments of the invention;

FIG. 13 depicts a cross-sectional, across-the gate view of the semiconductor structure after fabrication stages according to embodiments of the invention;

FIG. 14 depicts a cross-sectional, across-the gate view of the semiconductor structure after fabrication stages according to embodiments of the invention;

FIG. 15 depicts a cross-sectional, across-the gate view of the semiconductor structure after fabrication stages according to embodiments of the invention;

FIG. 16 depicts a cross-sectional, across-the gate view of the semiconductor structure after fabrication stages according to embodiments of the invention;

FIG. 17 depicts a cross-sectional, across-the gate view of the semiconductor structure after fabrication stages according to embodiments of the invention;

FIG. 18 depicts a cross-sectional, across-the gate view of the semiconductor structure after fabrication stages according to embodiments of the invention; and FIG. 19 depicts a cross-sectional, across-the gate view of the semiconductor structure after fabrication stages according to embodiments of the invention.

DETAILED DESCRIPTION

Figure 1:
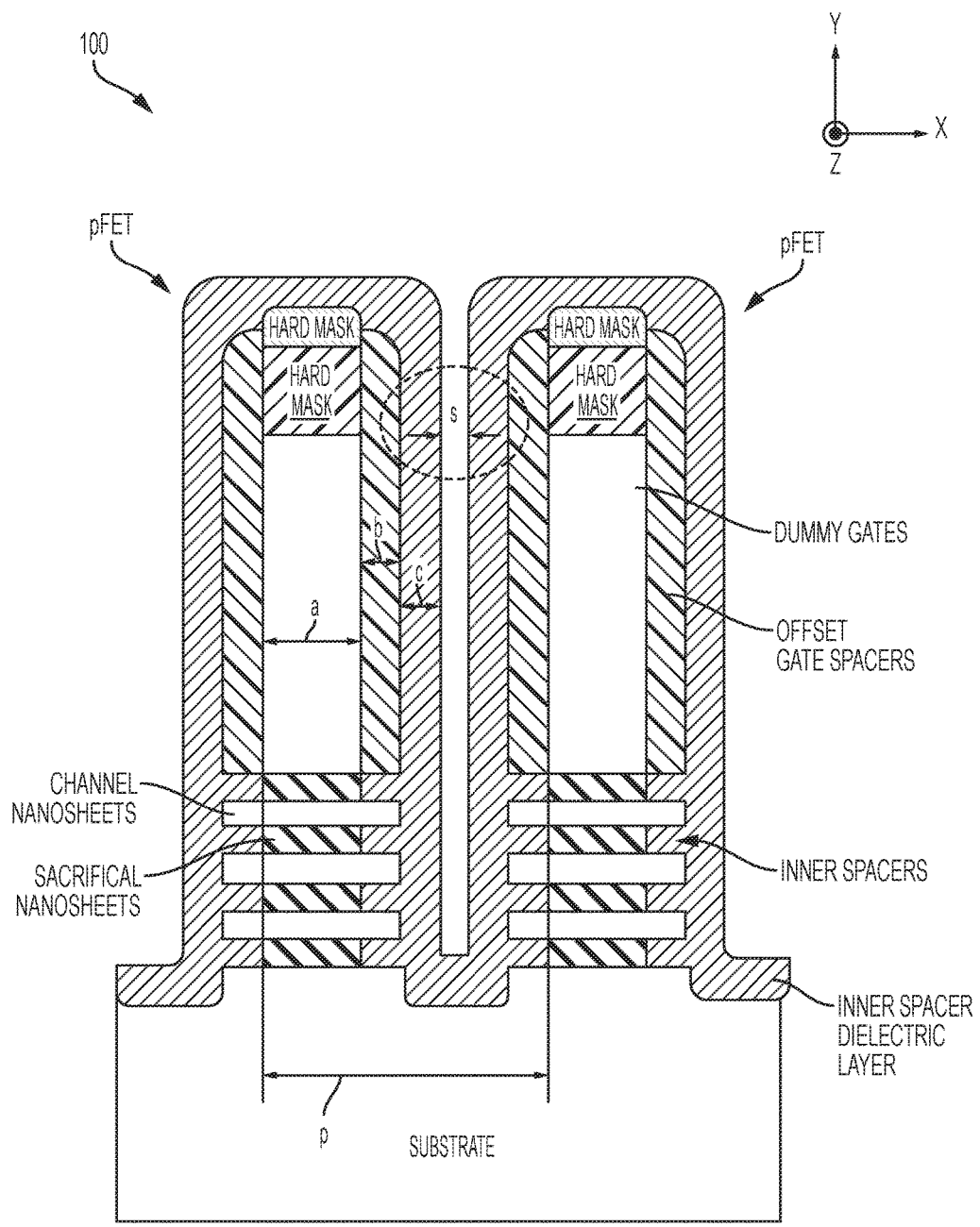
FIG. 1 depicts a cross-sectional view of a section of a substrate/wafer having adjacent nanosheet transistors formed thereon according to known fabrication methodologies and resulting structures.

It is understood in advance that although this invention includes a detailed description of exemplary gate-all-around (GAA) nano sheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs having increasingly smaller gate pitch. For example, in some nanosheet transistor architectures, inner spacers are provided between adjacent ones of the stacked channel nanosheets at end regions thereof. The inner spacers protect the channel nanosheets from the source and drain regions, and also provide electric isolation and support between the channels. However, known inner spacer formation techniques, which include depositing the material from which the inner spacers will be formed over the gate spacer, may or may not work when the gate pitch becomes smaller than about 50 nm. Accordingly, when attempting to use known inner spacer formation techniques at a gate pitch less than about 50 nm, there is not enough room left for inner spacer deposition between gate spacers considering process variability, which includes gate CD (critical dimension), overlay, LER (line-edge-roughness), and pitch variation.

An example of the problem addressed by aspects of the invention is illustrated in FIG. 1, which depicts a cross-sectional view of a section 100 of a substrate having adjacent pFET nanosheet structures formed thereon. The adjacent pFET nanosheet structures are depicted after completion of fabrication stages for forming the channel nanosheet, the sacrificial nanosheets, the dummy gates, the hard masks, and the offset gate spacers. The adjacent pFET nanosheet structures also depict completion of intermediate fabrication stages for forming the inner spacers by depositing an inner spacer dielectric layer over the offset spacers, around the channel nanosheets, and within spaces between the channel nanosheets. As depicted in FIG. 1, the CPP is "p," which can be about 40 nm, the width/thickness of the dummy gates, "a," can be about 10-15 nm, the thickness of the offset gate spacers, "b," can be about 4-7 nm, and the thickness of the inner spacer dielectric layer, "c," can be about 4-7 nm. Accordingly, the remaining space, "s," between the dummy gates after formation of the offset gate spacers and the inner spacer dielectric layer can be about 4-7 nm, which, for sub-44 nm CPP, is insufficient for the fabrication steps that are required to form the inner spacers from the inner spacer dielectric layer, particularly when considering the various relevant process variations, which can range from about 2 nm to about 10 nm.

Turning now to an overview of aspects of the invention, embodiments of the invention provide fabrication methods and resulting structures for forming the offset gate spacers (or outer spacers) and the inner spacers in nanosheet transistors that have relatively small spaces between the gates of adjacent nanosheet transistors (e.g., below about 7 nm). In embodiments of the invention, a dummy spacer is utilized to, in effect, "bookmark" or "reserve" the place for the "final" outer spacers. In downstream fabrication operations, the dummy (or placeholder) spacer is replaced with a layer of material that will be processed to form the final outer spacers and the inner spacers. In embodiments of the invention, the outer spacers are the same material as the inner spacers. The likelihood of gate pinch-off is reduced and spacer structural integrity is improved by utilizing the dummy gate spacers to define the final width dimension (Wf) of the channel nanosheets, removing the dummy gate spacers, and then forming both the final offset gate spacers and the inner spacers from a uniform layer of dielectric material. In embodiments of the invention, the uniform layer of dielectric material is formed from a low-k material. Using the gate spacer and inner spacer fabrication processes of the present invention, the remaining space between adjacent gates after formation of the uniform layer of dielectric layers is less than about 10 nm, which, for sub-44 nm CPP, is sufficient for the novel fabrication steps that are required to form the offset gate spacers and the inner spacers from the uniform spacer dielectric layer, even when considering the various relevant process variations, which can range from about 2 nm to about 10 nm. In some embodiments of the invention, the remaining space between adjacent gates after formation of the uniform layer of dielectric layers is from about 0 nm to about 10 nm, which, for sub-44 nm CPP, is sufficient for the novel fabrication steps that are required to form the offset gate spacers and the inner spacers from the uniform spacer dielectric layer, even when considering the various relevant process variations, which can range from about 2 nm to about 10 nm.

Turning now to a more detailed description of fabrication operations according to aspects of the invention, FIGS. 2-19 depict cross-sectional views of a section 200 of a substrate/wafer 102 after various fabrication operations to form nanosheet transistors in a pFET region 602 (shown in FIG. 6) and an nFET region 610 (shown in FIG. 6) on the same substrate 102 in accordance with embodiments of the invention. As shown in FIG. 2, after initial fabrication stages, an alternating series of SiGe sacrificial nanosheet layers 112, 114, 116 and Si nanosheet layers 122, 124, 126 have been formed in a stack over a bottom insulating layer 130 and over a silicon (Si) substrate 102. In some embodiments of the invention, the SiGe nanosheet layers 112, 114, 116 can be within a range from SiGe 20% to SiGe 40%. The notations "SiGe 20%" and "SiGe 40%" are used to indicate that about 20% of the SiGe material is Ge, or that about 40% of the SiGe material is Ge, respectively.

With reference to the X/Y/Z diagram depicted in FIG. 2, the various elements depicted in FIGS. 2-19 extend along a first axis (e.g., X-axis) to define width dimensions, and extend along a second axis (e.g., Y-axis) perpendicular to the X-axis to define height dimensions. Although not specifically depicted in the 2D cross-sectional views shown in FIGS. 2-19, the various elements depicted also extend along a third axis (e.g., Z-axis) perpendicular to the first axis and the second axis to define depth dimensions. In accordance with standard GAA nanosheet transistors architectures, various elements of the depicted fabrication stages extend completely around other elements in the X, Y, and Z directions.

In embodiments of the invention, the alternating nanosheet layers 112, 122, 114, 124, 116, 126 depicted in FIG. 2 can be formed by epitaxially growing one layer and then the next until the desired number and desired thicknesses of the nanosheet layers 112, 122, 114, 124, 116, 126 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 3A depicts a cross-sectional, across-the-fin view of the section/portion 200 of the substrate 102 after fabrication stages according to embodiments of the invention. FIG. 3B depicts a cross-sectional, across-the-gate view of the section/portion 200 of the substrate 102 shown in FIG. 3A, wherein the across-the-gate view results from rotating the across-the-fin view 90 degrees counterclockwise into the page. In FIGS. 3A and 3B, known semiconductor fabrication operations have been used to etch or recess the alternating nanosheet layers 112, 122, 114, 124, 116, 126 shown in FIG. 2 to form multiple intermediate elongated columns 202. In an example fabrication process, a patterned hard mask (not shown) is deposited over the alternating nanosheet layers 112, 122, 114, 124, 116, 126. The pattern of the hard mask defines the footprints of the multiple intermediate elongated columns 202 shown in FIGS. 3A and 3B. FIG. 3A is a view of the intermediate elongated columns 202 by a person standing in front the narrowest sidewalls of the intermediate elongated columns 202 (i.e., in the across-fin direction). FIG. 3B is a view of one of the intermediate elongated columns 202 by a person standing in front of the elongated sidewall of one of the intermediate elongated columns 202 (i.e., in the across-gate direction). An etch (e.g., an RIE) or a recess is applied to remove the portions of the alternating nanosheet layers that are not covered by the patterned hard mask, thereby forming the intermediate elongated columns 202.

The remaining FIGS. 4-19 are the cross-sectional, across-the-gate view used in FIG. 3B. In FIG. 4, known semiconductor fabrication operations have been used to form an amorphous silicon (a-Si) region 303, a bottom hard mask layer 305, and a top hard mask layer 307, configured and arranged as shown. Top and bottom hard mask 307, 305 can be but are not limited to SiN and $SiO_2$, all of which can contain C, B, N for patterning gates. Although only one of the intermediate elongated fin-shaped columns 202 is shown in the two-dimensional (X-axis and Y-axis) cross-sectional diagram shown in FIG. 4, multiple additional intermediate elongated fin-shaped columns (not shown) are positioned behind the intermediate elongated fin-shaped column 202 and extend into the page in the Z-axis direction. The additional intermediate elongated fin-shaped columns positioned behind the intermediate elongated fin-shaped column 202 are substantially the same as the intermediate elongated fin-shaped column 202. Similarly, although the a-Si region 303 is depicted in a cross-sectional, two-dimensional view in FIG. 4, in practice, the aSi region 303 is formed over and around the elongated sidewalls of each of the intermediate elongated fin-shaped columns 202 in the Z-axis direction.

In FIG. 5, known semiconductor fabrication operations have been used to form the dummy gates 304. For example, the dummy gates 304 can be formed by patterning the bottom hard mask layer 305 (shown in FIG. 4) and the top hard mask layer 307 (shown in FIG. 4) to form the hard masks 306, 308. An etching process (e.g., an RIE) is applied to the a-Si region 303 (shown in FIG. 4) to form the dummy gates 304.

Figure 6:
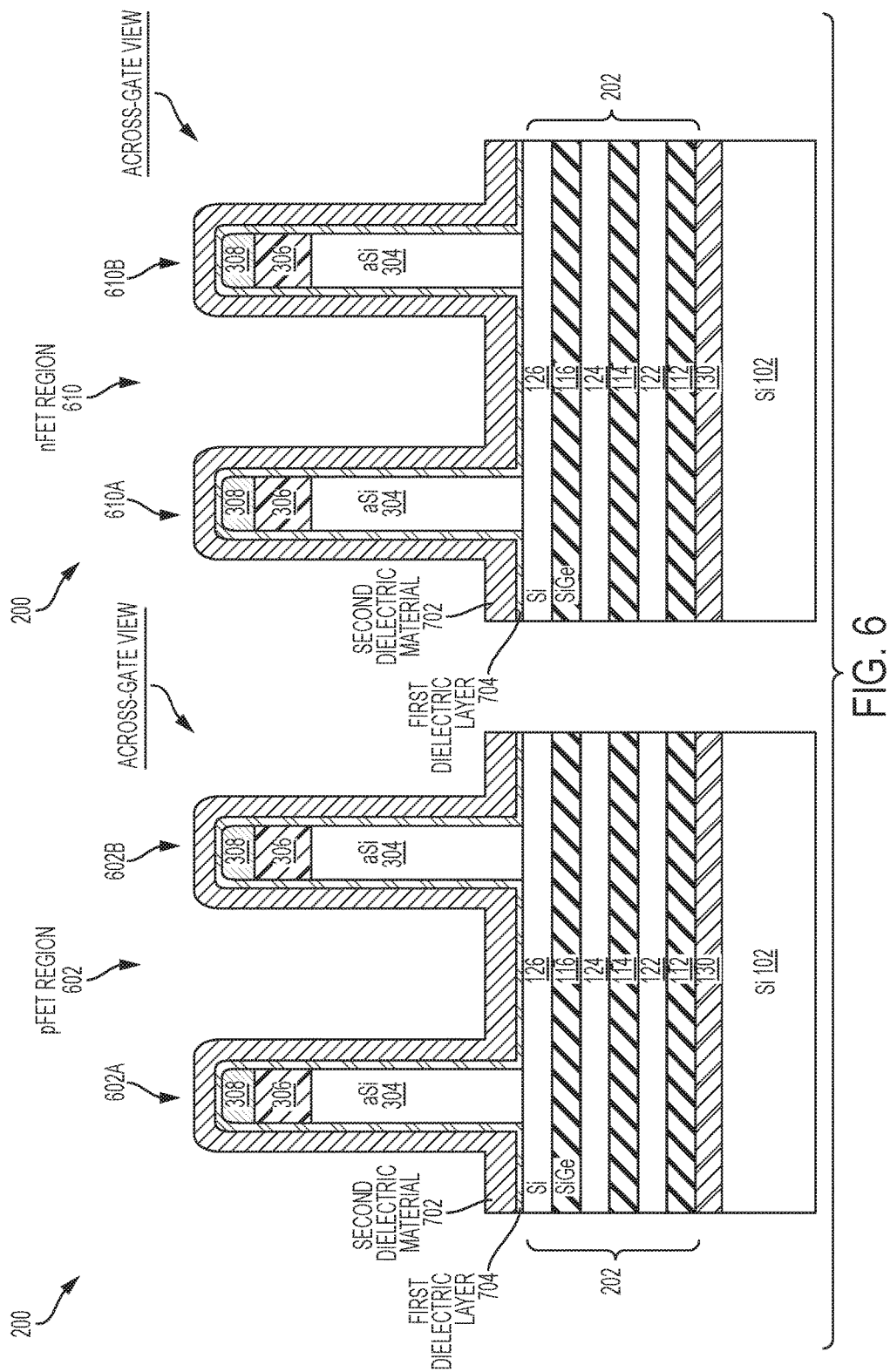

FIG. 6 depicts that the substrate 102 includes a pFET region 602, which includes two pFET structures under fabrication (hereinafter, "pFET" or "pFETs") 602A, 602B, along with an nFET region 610, which includes two nFET structures under fabrication (hereinafter, "nFET" or "nFETs") 610A, 610B. The number of pFETs and nFETs shown in FIG. 6 and subsequent figures is for ease of illustration and explanation, and, in practice, any number of pFETs and nFETs can be provided. For ease of illustration and explanation, FIGS. 7-11 and 19 depict only the pFET region 602 of the substrate 102. However, for any figure that depicts only the pFET region 602 or only the nFET region 610, all depicted operations apply equally to both the pFET region 602 and the nFET region 610 of the substrate 102.

Figure 7:
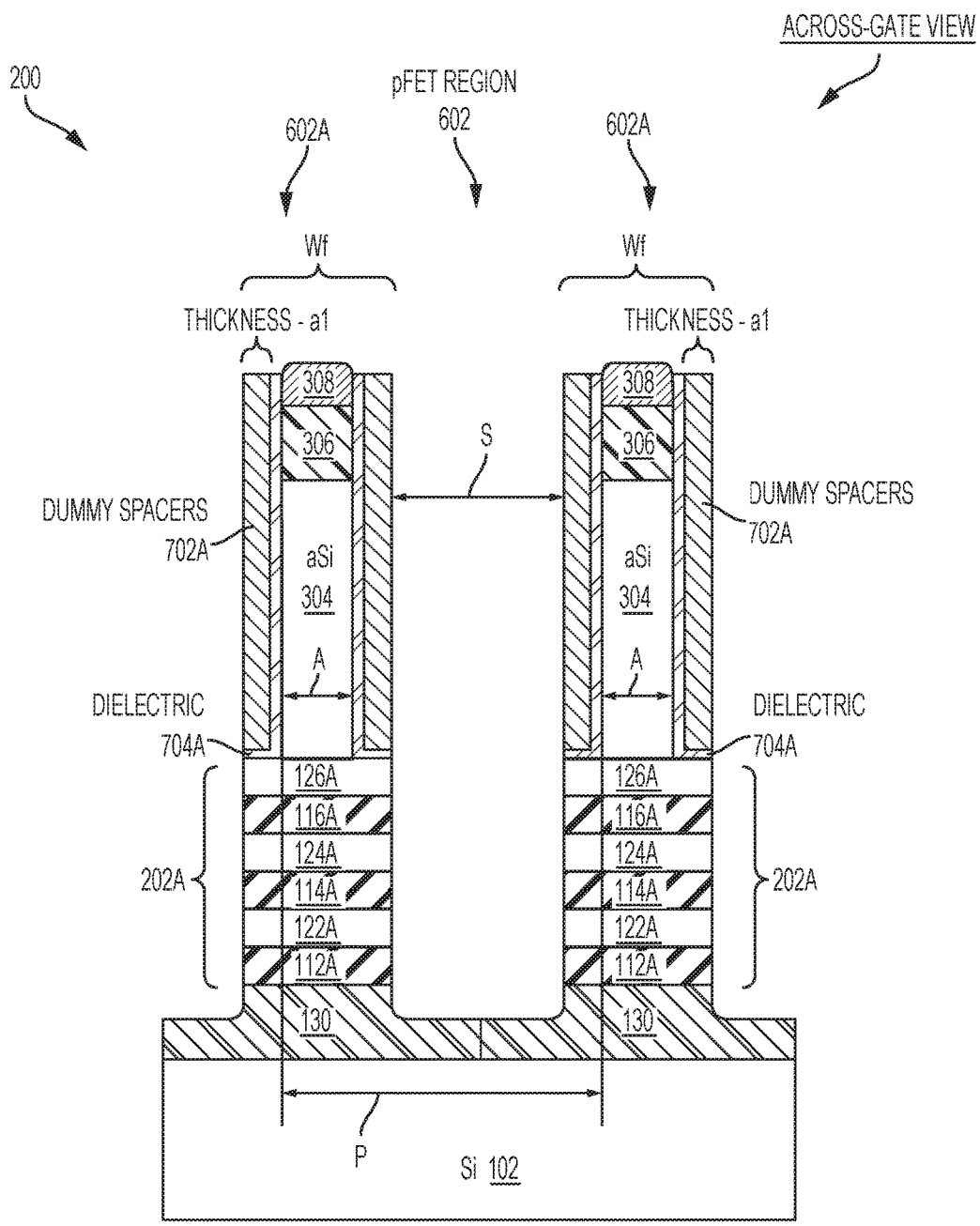

In FIGS. 6 and 7, known fabrication operations have been used to form the dummy offset gate spacers 702A (shown in FIG. 7) and the optional dielectric layer 704A (shown in FIG. 7). The dummy offset gate spacers 702A and the dielectric layer 704A can be formed by a conformal deposition of a first layer of dielectric material 704 (shown in FIG. 6) (e.g., a silicon oxide material) and a second layer of dielectric material 702 (shown in FIG. 6) (e.g., a silicon nitride material), followed by a directional etch (e.g., RIE) to form the dummy offset gate spacers 702A and the optional dielectric layer 704A. In embodiments of the invention, the thickness/width dimension a1 of the dummy gate spacers 702A is about 4-6 nm. In embodiments of the invention, the thickness dimension of the dielectric layer 704A is about 1-3 nm. In embodiments of the invention, the dummy offset gate spacers 702A can also be formed using a spacer pull down formation process.

As also shown in FIG. 7, subsequent to formation of the dielectric layer 704A and the dummy gate spacers 702A, an etch or a recess is applied to the exposed surfaces of the intermediate elongated columns 202 (shown in FIG. 6) to form two adjacent sets of final fin-shaped columns 202A each having a final width dimension (Wf). The etch/recess forms the fin-shaped columns 202A by etching/recessing the portions of the intermediate elongated fin-shaped columns 202 not covered by the dummy gates 304, the dielectric layer 704A, and the dummy offset gate spacers 702A. Each of the fin-shaped columns 202A includes a stack of alternating SiGe/Si nanosheet regions 112A, 122A, 114A, 124A, 116A, 126A. As depicted in FIG. 7, at this stage of the gate spacer and inner spacer fabrication processes of the present invention, the CPP is "P," the width/thickness of the dummy gates 304 is "A," and the thickness of the dummy offset gate spacers 702A is "a1." Accordingly, the remaining space "S" between adjacent ones of the dummy gates 304 after formation of the dummy offset gate spacers 702A is P−(A+2 (a1+the thickness of the dielectric layer 704A)), which, for sub-44 nm CPP and conventional width dimensions for the dummy gate spacers 702A and the dielectric layer 704A, provides sufficient space S for the fabrication steps that are required to form the final trimmed gate spacers 1102C (shown in FIG. 19) and the inner spacers 1102B (shown in FIG. 19). As a non-limiting example, the CPP or P dimension can be about 40 nm, the combined thickness of the dummy spacers 702A (a1) and the dielectric layer 704A can be about 6 nm to about 9 nm, and the width A of the dummy gates 304 can be from about 10 nm to about 15 nm. Accordingly, the remaining space S between the adjacent dummy gates 702A is about 7 nm to about 18 nm, which, for sub-44 nm CPP, is sufficient for the fabrication steps that are required to form the final trimmed gate spacers 1102C and the uniform inner spacers 1102B, even when considering the various relevant process variations that come into play when fabricating nanosheet transistors. The various relevant process variations can range from about 2 nm to about 10 nm.

Figure 8:
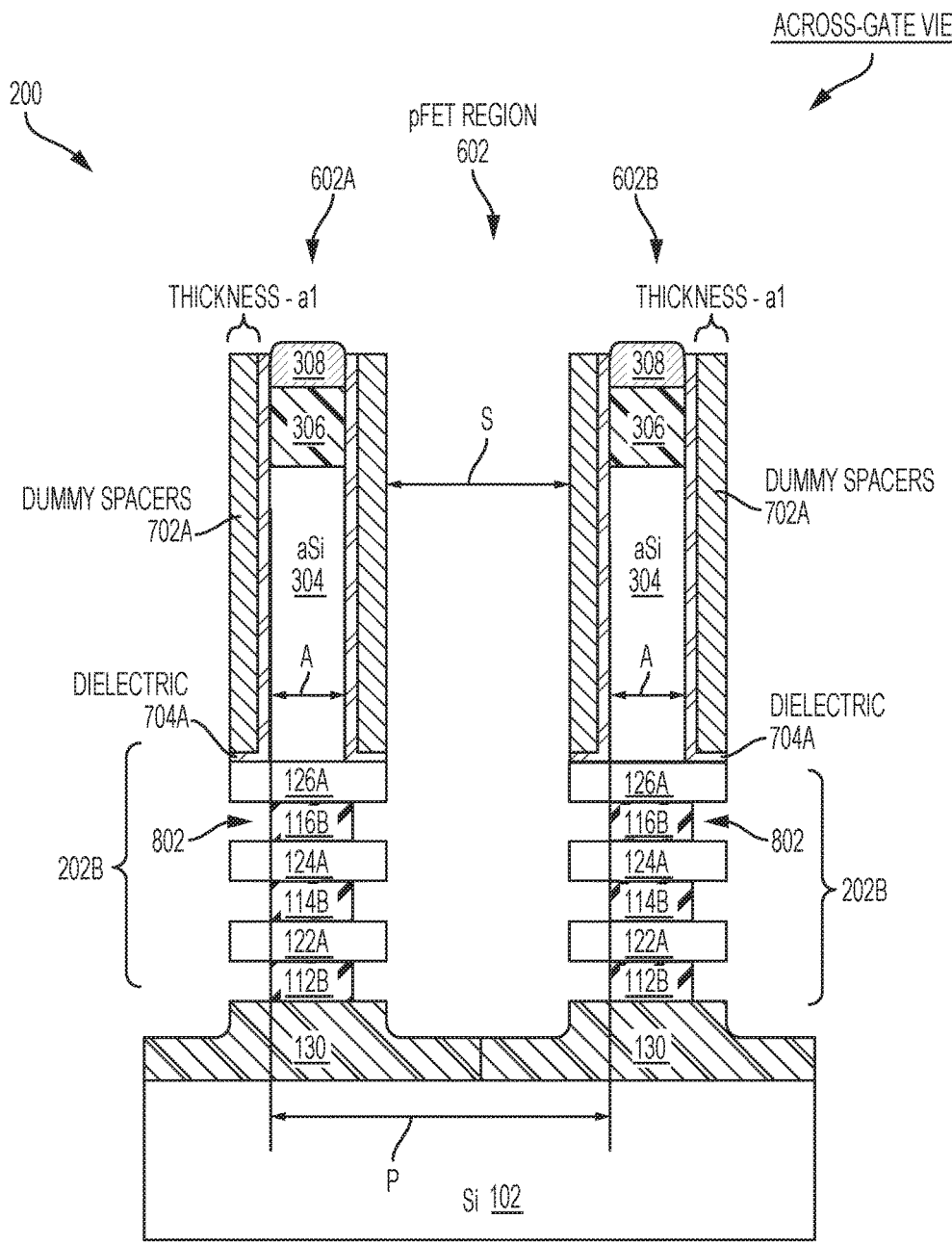

In FIG. 8, known semiconductor fabrication processes have been used to form pull back end region cavities 802 in the SiGe sacrificial nanosheet regions 112A, 114A, 116A (shown in FIG. 7) from underneath the dummy offset gate spacers 702A and the dielectric layer 704A using, for example, a hydrogen chloride (HCl) gas isotropic etch process, which etches SiGe without attacking Si. The end region cavities 802 are formed to thicknesses that substantially match the desired thickness of the to-be-formed inner spacers 1102B (shown in FIGS. 13 and 17). After formation of the end region cavities 802, sacrificial nanosheet central regions 112B, 114B, 116B remain.

Figure 9:
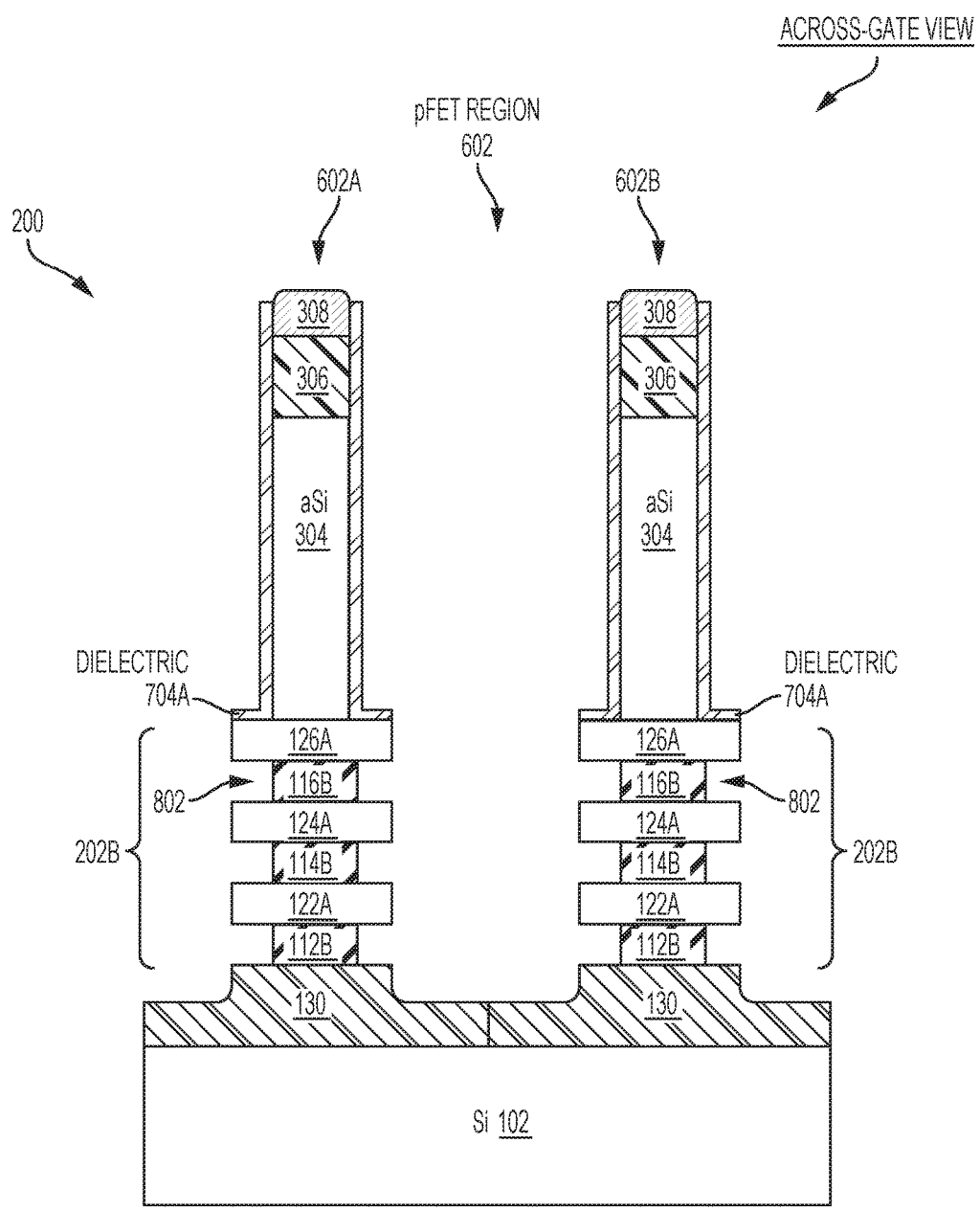
Figure 10:
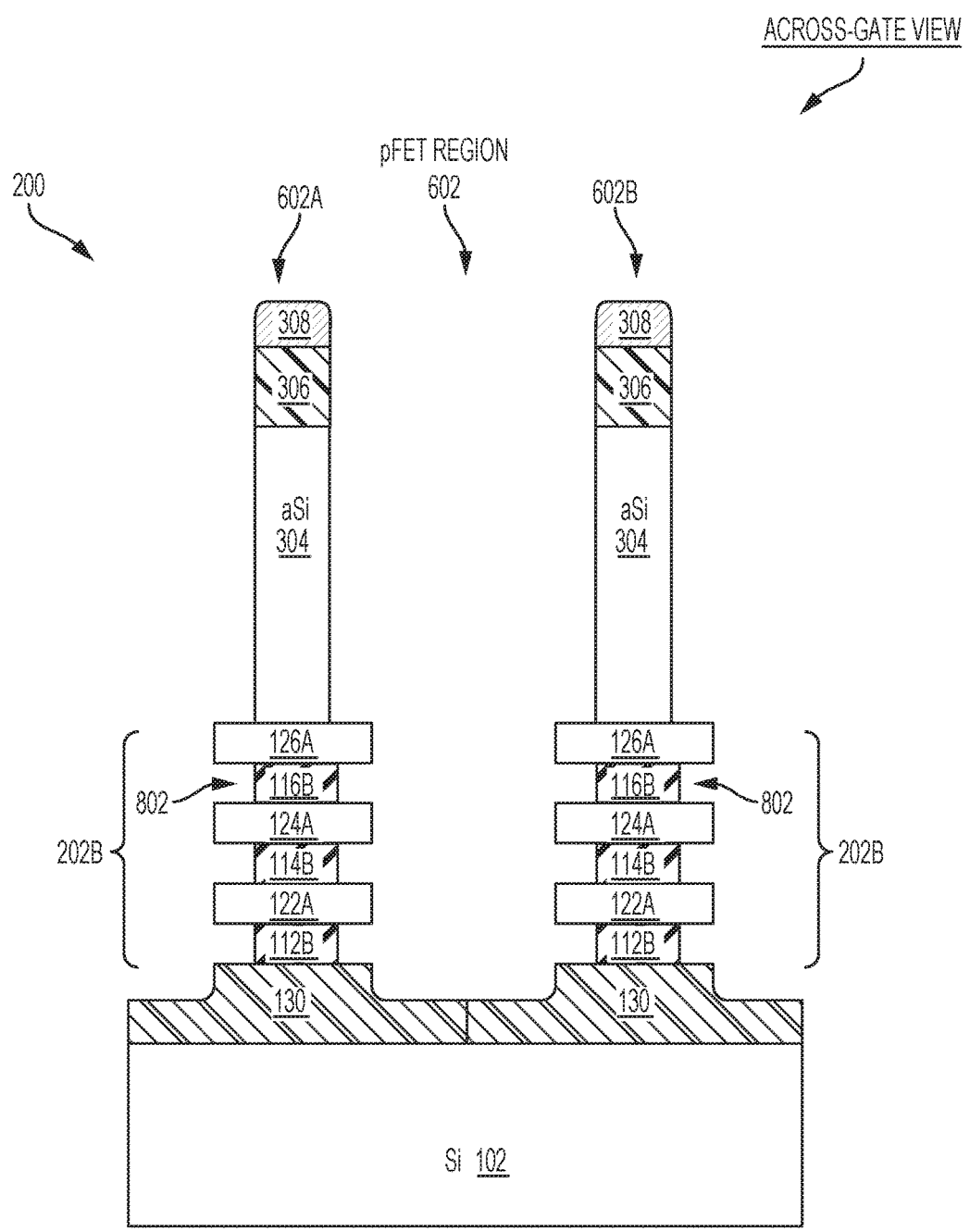

In FIG. 9, known semiconductor fabrication processes have been used to remove the dummy offset gate spacers 702A. In FIG. 10, known semiconductor fabrication processes have been used to remove the dielectric layer 704A. In accordance with aspects of the invention, the dummy spacers 702A (shown in FIG. 7) were utilized to, in effect, "bookmark" or "reserve" the place for the final trimmed gate spacers 1102C (shown in FIG. 19). In accordance with aspects of the invention, the dummy spacers 702A were also used to define the Wf dimension of the channel nanosheets 122A, 124A, 126A. In downstream fabrication operations, which are depicted in FIGS. 11-19, the dummy offset gate spacers 702A are replaced with final trimmed gate spacers 1102C (shown in FIG. 19) and the uniform inner spacers 1102B (shown in FIG. 19). In embodiments of the invention, the trimmed gate spacers 1102C and the uniform inner spacers 1102B are the same material. In embodiments of the invention, the trimmed gate spacers 1102C and the uniform inner spacers 1102B are a low-k material.

Figure 11:
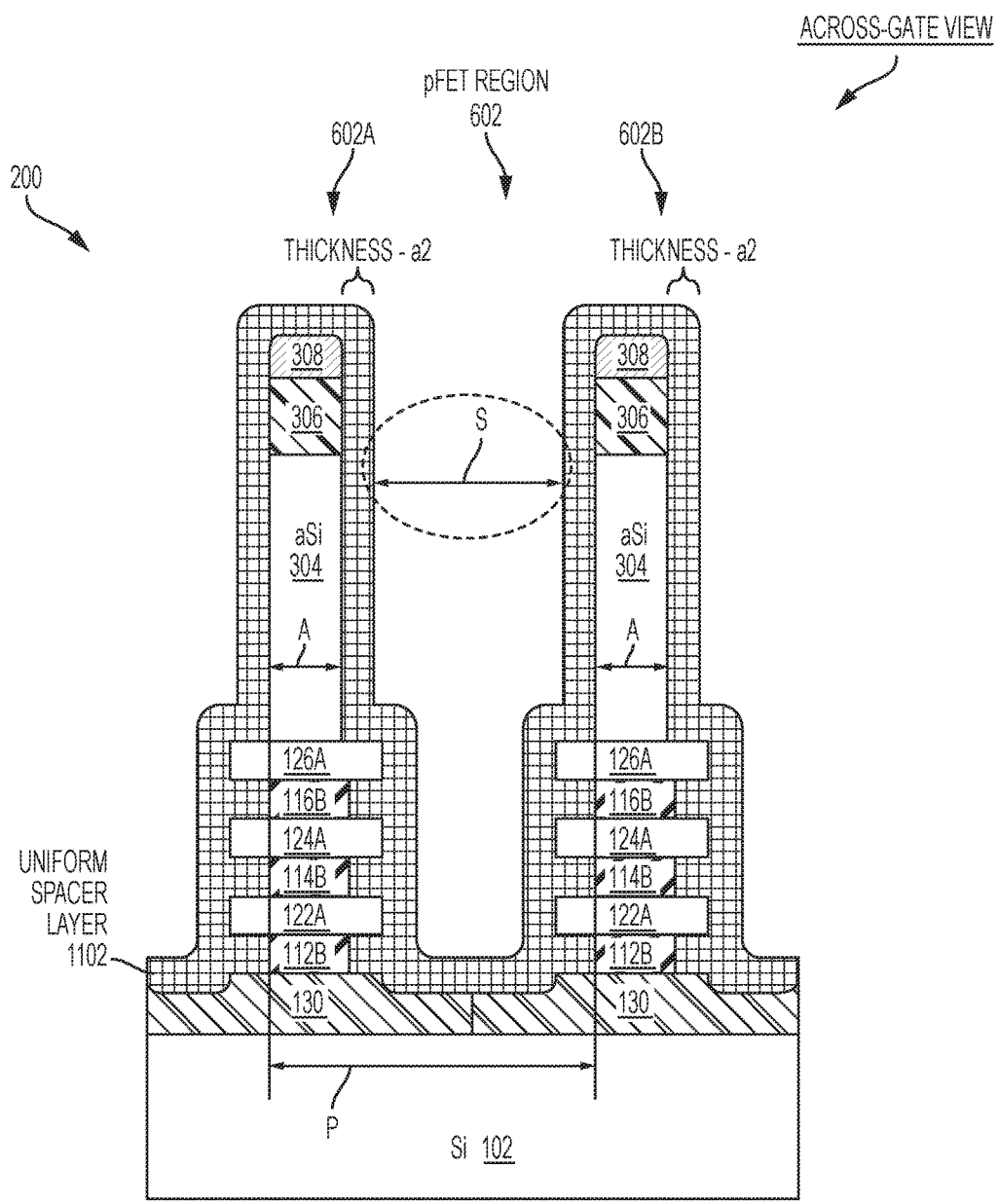

In FIG. 11, known semiconductor fabrication processes have been used to conformally deposit a dielectric layer 1102 to a thickness dimension a2 formed from a low-k material. In embodiments of the invention, the dielectric layer 1102 is a low-k material having sufficient thickness a2 to pinch-off and fill in the pull back end region cavities 802 (shown in FIG. 8). In embodiments of the invention, the thickness dimension a2 is less than about 6 nm. In embodiments of the invention, a2 can be substantially equal to or slightly smaller than a1, wherein a1 is the thickness of the dummy spacers 702A (shown in FIG. 8) that were utilized to, in effect, "bookmark" or "reserve" the place for the trimmed gate spacers 1102C (shown in FIG. 19). Expressed as a percentage, a2 qualifies as being slightly smaller than a1 if a2 is less than a1 and within about 20% of a1. At this stage of the gate spacer and inner spacer fabrication processes of the present invention, the CPP is "P," the width/thickness of the dummy gates 304 is "A," and the thickness of the uniform spacer layer 1102 is "a2." Accordingly, the remaining space "S" between adjacent ones of the dummy gates 304 after formation of the uniform spacer layer 1102 is S=P−(A+a2+a2), which, for a sub-44 nm CPP (or the P dimension), conventional width dimensions A for the dummy gates 304, and an a2 dimension that is less than the a1 dimension, sufficient space S is provided for the downstream fabrication operations that are used to form the final trimmed gate spacers 1102C (shown in FIG. 19) and the inner spacers 1102B (shown in FIG. 19). As a non-limiting example, the CPP or P dimension can be about 40 nm, the a2 thickness of the uniform spacer layer 1102 can be about 6 nm to about 9 nm, and the width A of the dummy gates 304 can be from about 10 nm to about 15 nm. Accordingly, the remaining space S is about 7 nm to about 18 nm, which, for sub-44 nm CPP, is sufficient for the fabrication steps that are required to form the final trimmed gate spacers 1102C and the uniform inner spacers 1102B, even when considering the various relevant process variations that come into play when fabricating nanosheet transistors. The various relevant process variations can range from about 2 nm to about 10 nm.

FIGS. 12-18 show views of the substrate 102 that depict one pFET 602A in the pFET region 602, along with one nFET 610A in the n FET region 610. The number of pFETs and nFETs shown in FIGS. 12-18 is for ease of illustration and explanation, and, in practice, any number of pFETs and nFETs can be provided. For any figure that depicts only one pFET (e.g., pFET 602A) or only one nFET (e.g., nFET 610A), all depicted operations apply equally to any other pFET in the pFET region 602 and to any other nFET in the nFET region 610.

Figure 12:
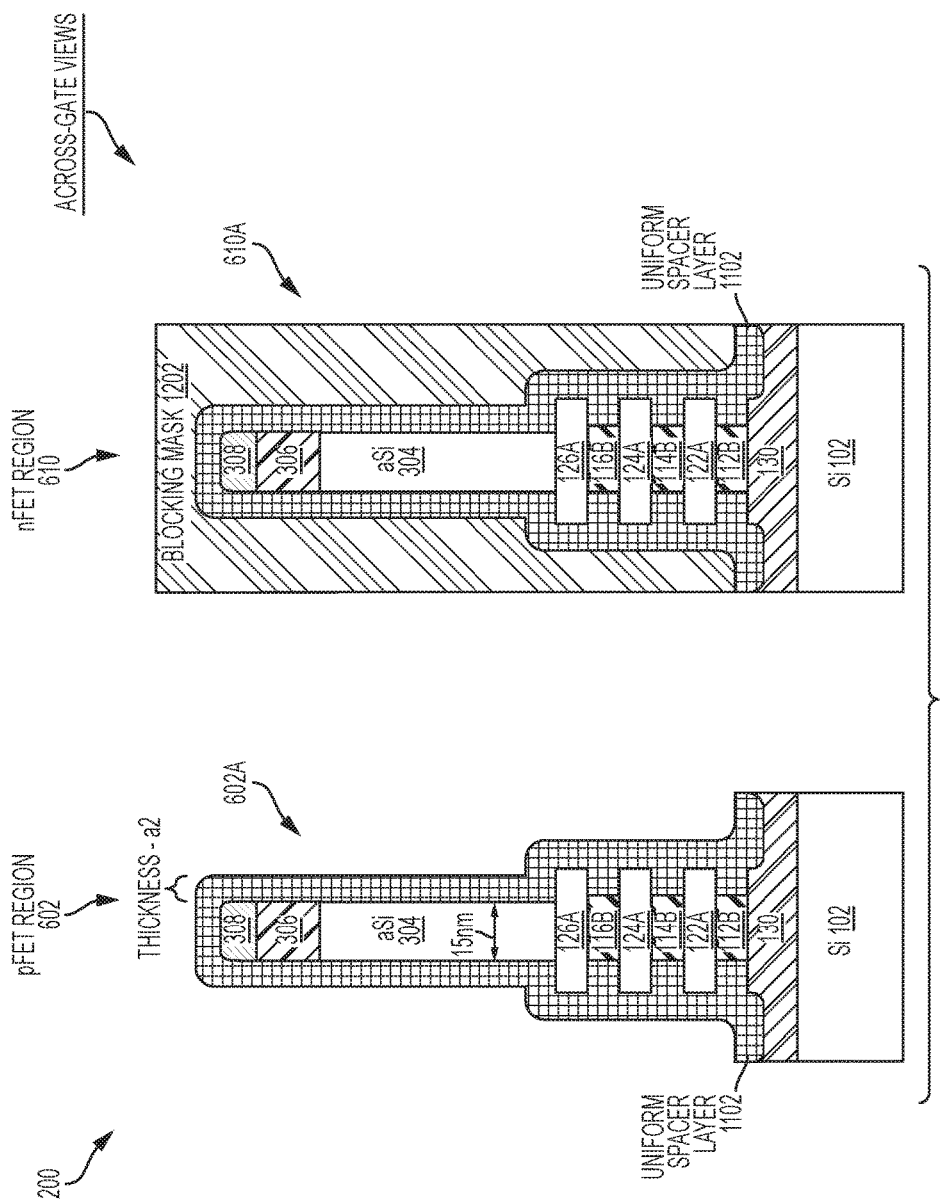

In FIG. 12, known semiconductor fabrication processes have been used to deposit a blocking mask 1202 over the nFET region 610 of the substrate 102. In embodiments of the invention, the blocking mask 1202 is an organic planarization layer (OPL). In general, OPLs are used as etch masks for pattern transfers into inorganic substrates, to fill pre-existing features, and to planarize the substrate to allow for larger patterning process windows.

Figure 13:
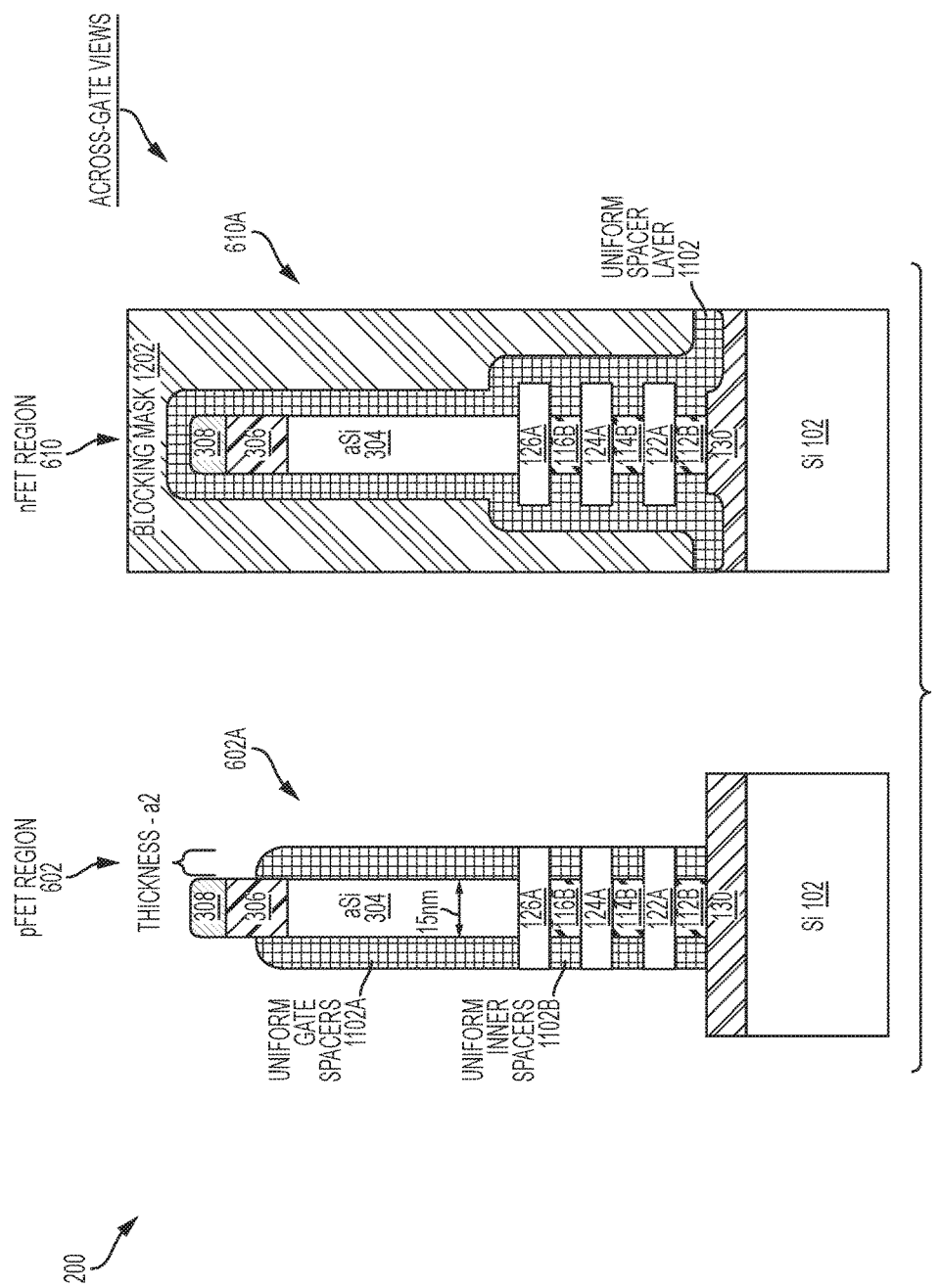

In FIG. 13, known semiconductor fabrication processes have been used to remove selected exposed portions of the uniform spacer layer 1102. In embodiments of the invention, the known semiconductor fabrication processes include a directional etch selective to the material from which the uniform spacer layer 1102 is formed, which is tailored (e.g., timed) to substantially remove the portions of the uniform spacer layer 1102 that cover the bottom dielectric region 130, sidewalls of the channel nanosheets 122A, 124A, 126A, the hard masks 308, and portions of the sidewalls of the hard mask 306. After applying the direction etch to the uniform spacer layer 1102, the uniform gate spacers 1102A and the uniform inner spacers 1102B remain. In embodiments of the invention, the uniform spacer layer 1102, uniform gate spacers 1102A, and uniform inner spacers 1102B are formed from low-k material, which reduces the gate to S/D capacitance. In general, a material is considered low-k when its k-value or dielectric constant is similar to or less than the k-value of $SiO_2$, which is generally accepted to be about 3.9. However, for gate spacer applications formed from SiN to provide greater process control, materials with k-values lower than SiN could be considered as low-k spacer material. The k-value of SiN is about 7.0. In embodiments of the invention, the low-k material can be a dielectric material having a dielectric constant in the range from about 4 to about 6. Examples of the suitable low-k material includes but is not limited to SiBCN, SiOCN, SiOCN, SiOC, SiCOH, and the like.

Figure 14:
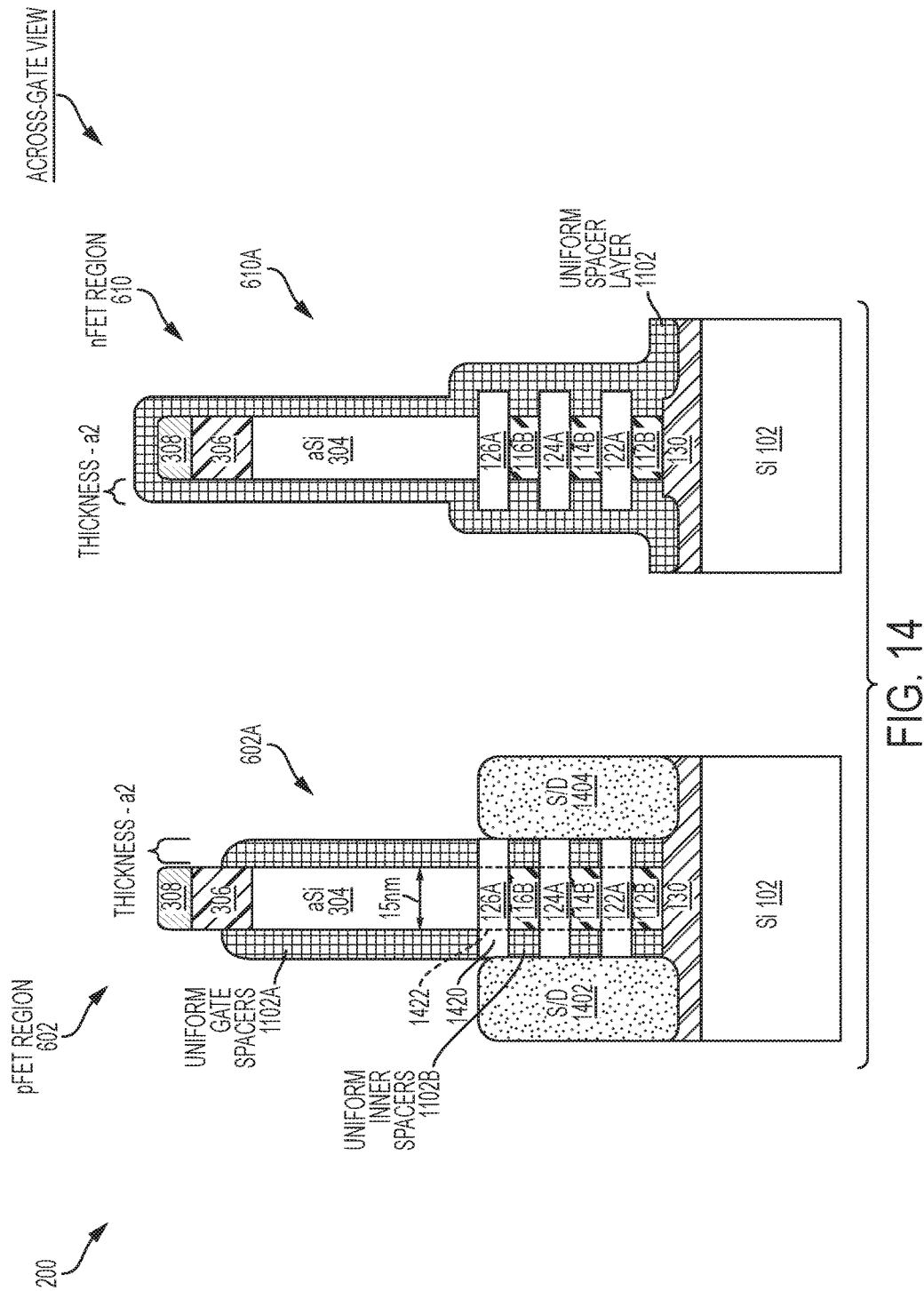

In FIG. 14, known semiconductor device fabrication processes have been used to form source/drain (S/D) regions 1402, 1404. In embodiments of the invention, the S/D regions 1402, 1404 are formed using an epitaxial layer growth process on the exposed sidewalls of the Si channel nanosheet regions 122A, 124A, 126A. In-situ doping (ISD) can be applied to form doped S/D regions 1402, 1404, thereby creating the necessary junctions (source/channel or drain/channel) for the nanosheet transistors that will be formed in the pFET region 602 and the nFET region 610. Virtually all semiconductor transistors are based on the formation of junctions. Junctions are capable of both blocking current and allowing it to flow, depending on an applied bias. Junctions are typically formed by placing two semi-conductor regions with opposite polarities into contact with one another. The most common junction is the p–n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the S/D regions 1402, 1404 are controlled in a manner that forms extension regions 1420 having extension junctions 1422 within the Si channel nanosheet regions (e.g., Si nanosheet regions 122A, 124A, 126A). For ease of illustration, only one example of the extension regions 1420 and extension junctions 1422 are provided with reference numbers. Extension regions 1420 and extension junctions 1422 extend under uniform gate spacers 1102A and the uniform inner spacers 1102B, and the regions of the Si channel nanosheets 122A, 124A, 126A under the gate dummy gates 304 remain undoped. In embodiments of the invention, the doping of extension regions 1420 can be performed by implanting the end regions of the Si channel nanosheet regions 122A, 124A, 126A with ions (or dopants) (e.g., through epitaxy or through ion implantation). Extension junctions 1420 reduce the $R_{ext}$ of the final nanosheet transistors when they are turned on by applying the appropriate gate bias voltages. The extension junctions 1420 also form a conducting path between the S/D regions 1402, 1404 and the Si channel nanosheet regions 122A, 124A, 126A. In order to optimize transistor performance, the extension junctions 1420 can be positioned such that they terminate in substantially the same plane that the final metal gate structure (not shown) and/or the final work function metal (WFM) gate structure 1404 (not shown). According to embodiments of the invention, a replacement-metal-gate (RMG) fabrication process will be used to replace the dummy gates 304 with a metal gate structure. Referring still to FIG. 14, known semiconductor fabrication operations have also been used to remove the blocking region 1202.

Figure 15:
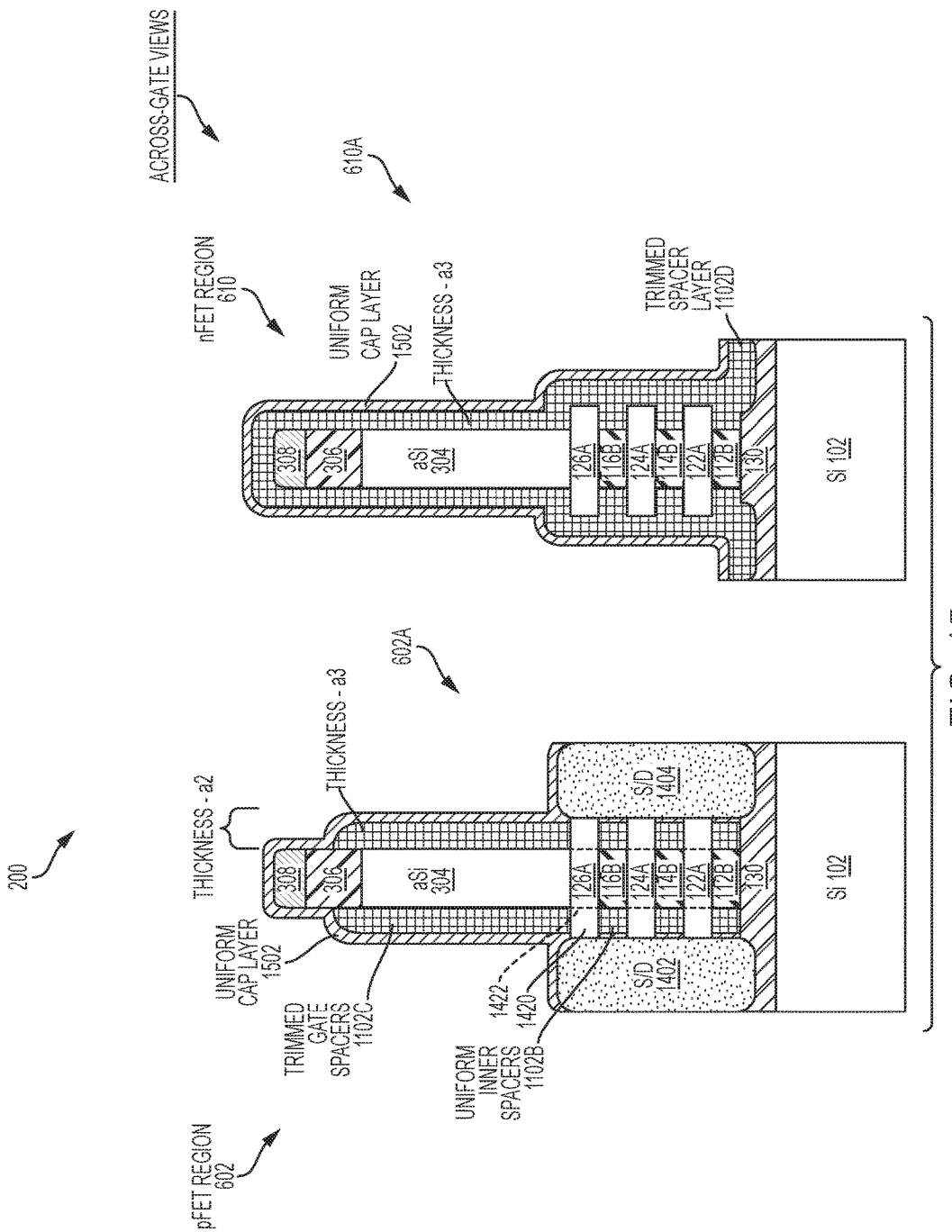

In FIG. 15, known semiconductor fabrication operations have been used to trim back the uniform gate spacers 1102A (shown in FIG. 14) to form trimmed gate spacers 1102C in the pFET region 602. The trimmed gate spacers 1102C have a thickness dimension a3. In FIG. 15, known semiconductor fabrication operations have also been used to trim back the uniform spacer layer 1102 (shown in FIG. 14) to form a trimmed spacer layer 1102D in the nFET region 610A. The trimmed spacer layer 1102D has a thickness dimension a3. In FIG. 15, known semiconductor fabrication operations have also been used to deposit a uniform cap layer 1502 as shown. In embodiments of the invention, the thickness of the uniform cap layer 1502 is substantially the same as the distance that the uniform gate spacers 1102A and the uniform spacer layer 1102 have been trimmed back, thereby allowing the trimmed gate spacers 1102C and the uniform cap layer 1502 (or the trimmed spacer layer 1102D and the uniform cap layer 1502) to occupy the same lateral thickness dimension as the uniform gate spacer 1102A.

Figure 16:
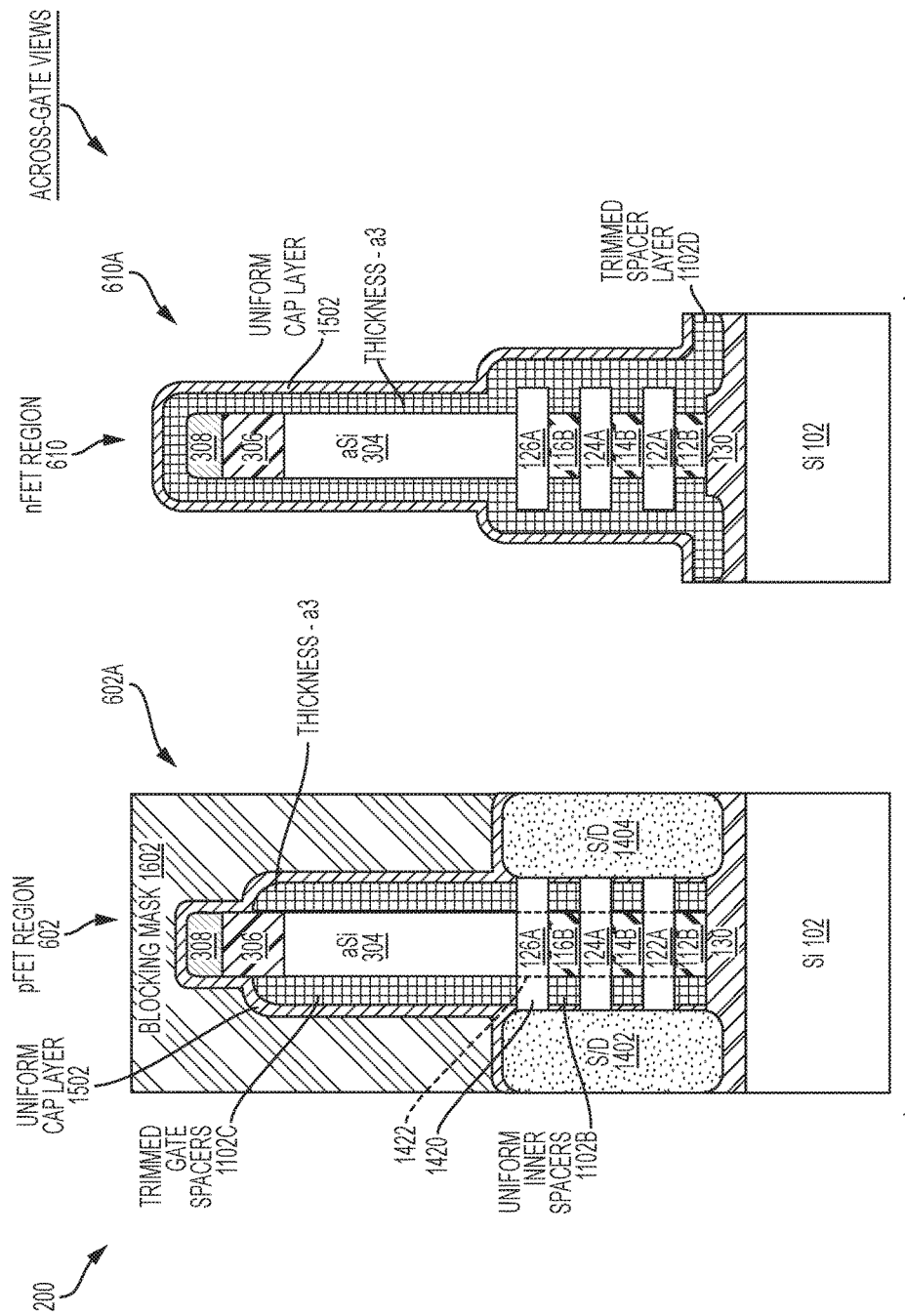

In FIG. 16, known semiconductor fabrication processes have been used to deposit a blocking mask 1602 over the pFET region 602 of the substrate 102. In embodiments of the invention, the blocking mask 1602 is an OPL. In general, OPLs are used as etch masks for pattern transfers into inorganic substrates, to fill pre-existing features, and to planarize the substrate to allow for larger patterning process windows.

Figure 17:
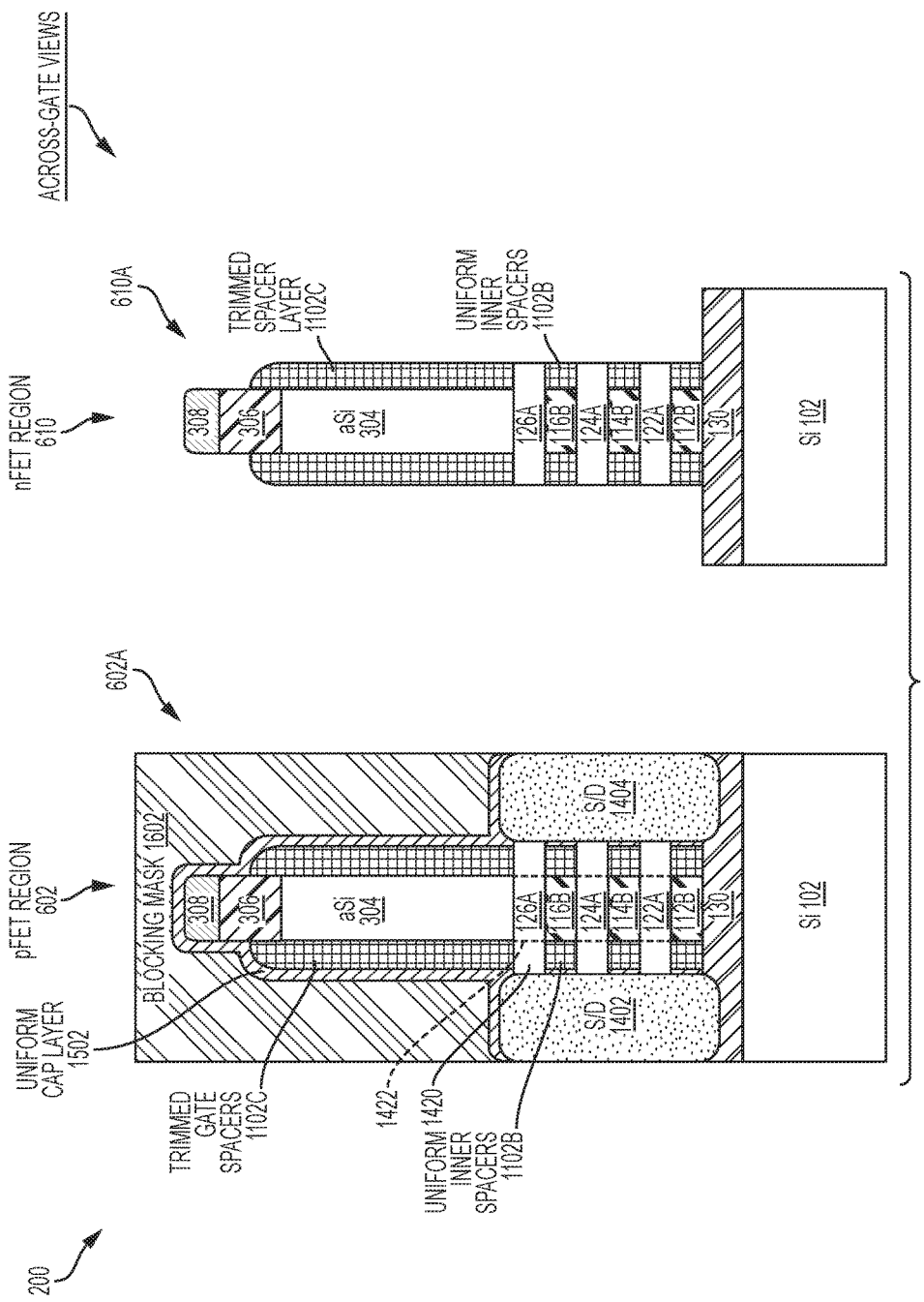

In FIG. 17, known semiconductor fabrication processes have been used to remove selected exposed portions of the cap layer 1502 (shown in FIG. 16) and the trimmed spacer layer 1102D (shown in FIG. 16). In embodiments of the invention, the known semiconductor fabrication processes include one or more directional etch selective to the materials from which the cap layer 1502 and the trimmed spacer layer 1102D are formed, which is tailored (e.g., timed) to substantially remove all of the cap layer 1502 from the nFET region 610, as well as remove the portions of the trimmed spacer layer 1102D that cover the bottom dielectric region 130, sidewalls of the channel nanosheets 122A, 124A, 126A, the hard masks 308, and portions of the sidewalls of the hard mask 306. After applying the direction etch to the uniform spacer layer 1102, the uniform gate spacers 1102A and the uniform inner spacers 1102B remain. In embodiments of the invention, the uniform gate spacers 1102D and uniform inner spacers 1102B are formed from low-k material, which reduces the gate to S/D capacitance. In general, a material is considered low-k when its k-value or dielectric constant is similar to or less than the k-value of $SiO_2$, which is generally accepted to be about 3.9. However, for gate spacer applications formed from SiN to provide greater process control, materials with k-values lower than SiN could be considered as low-k spacer material. The k-value of SiN is about 7.0. In embodiments of the invention, the low-k material can be a dielectric material having a dielectric constant in the range from about 4 to about 6. Examples of the suitable low-k material includes but is not limited to SiBCN, SiOCN, SiOCN, SiOC, SiCOH, and the like.

Figure 18:
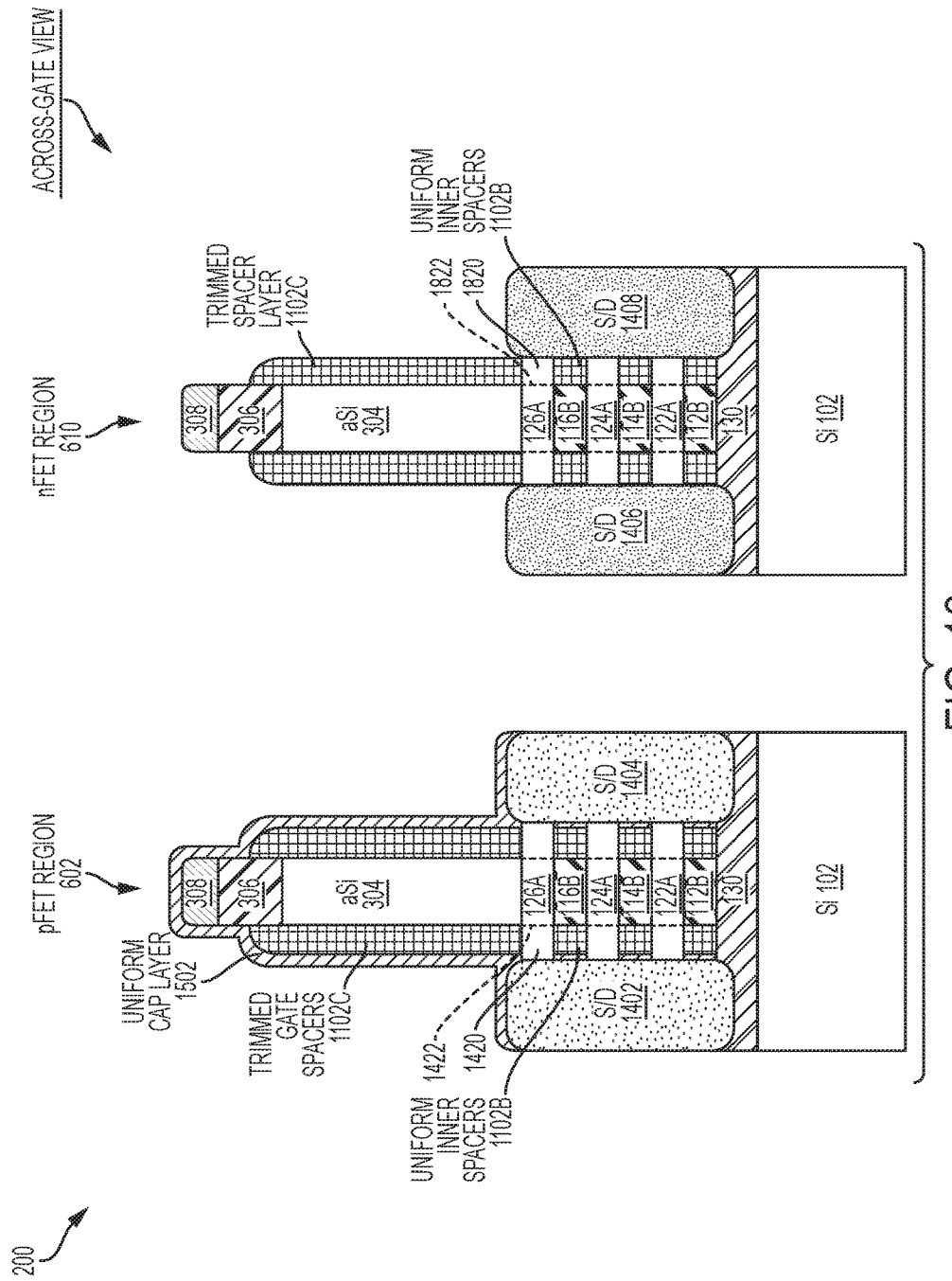

In FIG. 18, known semiconductor device fabrication processes have been used to form source/drain (S/D) regions 1406, 1408. In embodiments of the invention, the S/D regions 1406, 1408 are formed using an epitaxial layer growth process on the exposed sidewalls of the Si channel nanosheet regions 122A, 124A, 126A. In-situ doping (ISD) can be applied to form doped S/D regions 1406, 1408, thereby creating the necessary junctions (source/channel or drain/channel) for the nanosheet transistors that will be formed in the pFET region 602 and the nFET region 610. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p–n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the S/D regions 1406, 1408 are controlled in a manner that forms extension regions 1820 having extension junctions 1822 within the Si channel nanosheet regions (e.g., Si nanosheet regions 122A, 124A, 126A). For ease of illustration, only one example of the extension regions 1820 and extension junctions 1822 are provided with reference numbers. Extension regions 1820 and extension junctions 1822 extend under uniform gate spacers 1102A and the uniform inner spacers 1102B, and the regions of the Si channel nanosheets 122A, 124A, 126A under the gate dummy gates 304 remain undoped. In embodiments of the invention, the doping of extension regions 1820 can be performed by implanting the end regions of the Si channel nanosheet regions 122A, 124A, 126A with ions (or dopants) (e.g., through epitaxy or through ion implantation). Extension junctions 1820 reduce the $R_{ext}$ of the final nanosheet transistors when they are turned on by applying the appropriate gate bias voltages. The extension junctions 1820 also form a conducting path between the S/D regions 1406, 1408 and the Si channel nanosheet regions 122A, 124A, 126A. In order to optimize transistor performance, the extension junctions 1820 can be positioned such that they terminate in substantially the same plane that the final metal gate structure (not shown) and/or the final work function metal (WFM) gate structure 1404 (not shown). According to embodiments of the invention, a replacement-metal-gate (RMG) fabrication process will be used to replace the dummy gates 304 with a metal gate structure. Referring still to FIG. 14, known semiconductor fabrication operations have also been used to remove the blocking region 1202.

Figure 19:
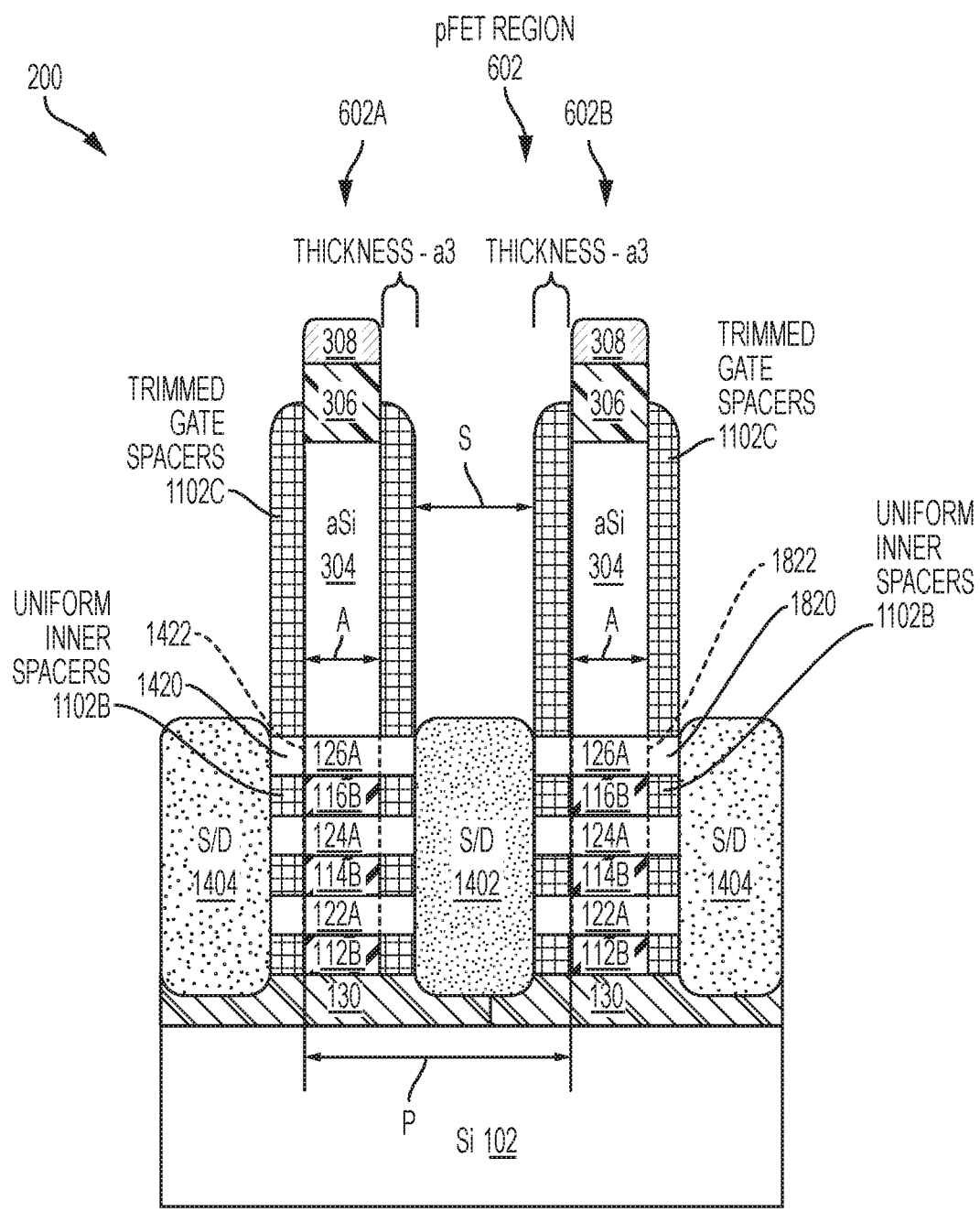

FIG. 19 depicts only the pFET region 602 of the substrate 102. However, as previously noted herein, for any figure that depicts only the pFET region 602 or only the nFET region 610, all depicted operations apply equally to both the pFET region 602 and the nFET region 610 of the substrate 102. As shown in FIG. 19, subsequent to formation of the S/D regions 1406, 1408, the extension regions 1820, and the extension junctions 1822, the cap layer 1502 is removed from over the pFET region 602. As also shown in FIG. 19, in accordance with aspects of the invention, using the gate spacer and inner spacer fabrication processes of the present invention, the remaining space S after formation of the trimmed gate spacers 1102C is S=P−(A+a3+a3), which, for sub-44 nm CPP, dummy gate 304 with widths between about 10 nm and about 15 nm, and for a3 values between about 3 nm and about 4 nm, is sufficient for the fabrication steps that are required to form the offset gate spacers 1102C and the inner spacers 1102B from the uniform spacer dielectric layer 1102 (shown in FIG. 11), even when considering the various relevant process variations described herein, which can range from about 2 nm to about 8 nm.

In fabrication operations downstream from the fabrication operations depicted in FIGS. 2-19, the dummy gates 304 and the sacrificial nanosheets 112B, 114B, 116B are removed by a known etching process, e.g., RIE (reactive ion etching) or wet process. In a gate-late fabrication process, the removed dummy gate structure 304 is thereafter replaced with a metal gate (not shown) as known in the art. Dummy gate 304 can be removed by an etching process, e.g., RIE or to form a trench. A dielectric material and one or more gate metals (not shown) can then be deposited within the trench. For example, an HK dielectric material, e.g., hafnium based material, can be deposited to form a gate dielectric. A metal liner, e.g., a work-function metal, and a gate metal can then be deposited on the dielectric material to complete the gate formation. In one or more embodiments, the metal liner can be, for example, TiN or TaN, and the gate metal can be aluminum or tungsten.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    performing fabrication operations to form a nanosheet field effect transistor (FET) device on a substrate;
    wherein the fabrication operations include:
        forming a gate spacer along a gate region of the nanosheet FET device;
        forming channel nanosheets to a desired final channel nanosheet width dimension (Wf) for each of the channel nanosheets;
        forming an inner spacer between the channel nanosheets;
        wherein the gate spacer and the inner spacer comprise the same type of spacer material;
        wherein forming the gate spacer and the inner spacer comprises, subsequent to forming the channel nanosheets to the desired Wf, conformally depositing a layer of the spacer material having a first thickness dimension to extend along a sidewall of the gate region, sidewalls of the channel nanosheets, and within a space between the channel nanosheets;
        wherein forming the gate spacer and the inner spacer further comprises performing an etch operation that removes a portion of the layer of spacer material that extends along sidewalls of the channel nanosheets; and
        separately from forming the gate spacer and the inner spacer by performing the etch operation that removes the portion of the layer of spacer material that extends along sidewalls of the channel nanosheets, trimming a portion of the layer of the spacer material that is along the sidewall of the gate region such that the portion of the spacer layer that is along the sidewall of the gate region comprises a second thickness dimension that is less than the first thickness dimension;
        wherein the gate spacer comprises the portion of the layer of the spacer material that comprises the second thickness dimension and is along the sidewall of the gate region;
        wherein the inner spacer comprises a portion of the layer of the spacer material that is within the space between the channel nanosheets.

2. The method of claim 1, wherein the gate spacer comprises a gate spacer sidewall.

3. The method of claim 2, wherein the inner spacer comprises an inner spacer sidewall.

4. The method of claim 3, wherein the gate spacer sidewall is substantially co-planar with the inner spacer sidewall.

5. The method of claim 1, wherein the spacer material comprises a low-k material.

6. The method of claim 1, wherein forming the channel nanosheets to the desired Wf comprises forming dummy gate spacers over channel nanosheet layers.

7. The method of claim 6, wherein forming the channel nanosheets to the desired Wf further comprises removing portions of the channel nanosheet layers that are not covered by the dummy gates spacers.

8. The method of claim 7, wherein the fabrication operations further comprise removing the dummy gate spacers prior to conformally depositing the layer of the spacer material to extend along the sidewall of the gate region, the sidewalls of the channel nanosheets, and within the space between the channel nanosheets.

9. A method of fabricating adjacent semiconductor devices, the method comprising:
    performing fabrication operations to form a first nanosheet field effect transistor (FET) device and a second nanosheet FET on a substrate;
    wherein the fabrication operations to form the first nanosheet FET include:
        forming a first gate spacer along a first gate region of the first nanosheet FET device;
        forming first channel nanosheets to a desired first final channel nanosheet width dimension (F-Wf) for each of the first channel nanosheets; and
        forming a first inner spacer between the first channel nanosheets;
    wherein the fabrication operations to form the second nanosheet FET include:

forming a second gate spacer along a second gate region of the second nanosheet FET device;

forming second channel nanosheets to a desired second final channel nanosheet width dimension (S-Wf) for each of the second channel nanosheets;

forming a second inner spacer between the second channel nanosheets;

wherein the first gate spacer, the second gate spacer, the first inner spacer, and the second inner spacer comprise the same type of spacer material;

wherein F-Wf is substantially the same as S-Wf;

wherein forming the first gate spacer, the second gate spacer, the first inner spacer, and the second inner spacer comprises, subsequent to forming the first channel nanosheets to the F-Wf and forming the second channel nanosheets to the S-Wf, conformally depositing a layer of the spacer material having a first thickness dimension to extend along a sidewall of the first gate region, a sidewall of the second gate region, sidewalls of the first channel nanosheets, sidewalls of the second channel nanosheets, within a space between the first channel nanosheets, and within a space between the second channel nanosheets;

separately from forming the layer of the spacer material having the first thickness, trimming a portion of the layer of the spacer material that is along the sidewall of the first gate region such that the portion of the spacer layer that is along the sidewall of the first gate region comprises a second thickness dimension that is less than the first thickness dimension;

wherein forming the first gate spacer, the second gate spacer, the first inner spacer, and the second inner spacer further comprises performing an etch operation that removes a portion of the layer of spacer material that extends along sidewalls of the first channel nanosheets and along sidewalls of the second channel nanosheets; and separately from forming the first gate spacer, the second gate spacer, the first inner spacer, and the second inner spacer by performing an etch operation that removes a portion of the layer of spacer material that extends along sidewalls of the first channel nanosheets and along sidewalls of the second channel nanosheets, trimming a portion of the layer of the spacer material that is along the sidewall of the second gate region such that the portion of the spacer layer that is along the sidewall of the second gate region comprises the second thickness dimension that is less than the first thickness dimension;

wherein a trimmed first gate spacer comprises the portion of the layer of the spacer material that comprises the second thickness dimension and is along the sidewall of the first gate region;

wherein the first inner spacer comprises a portion of the layer of the spacer material that is within the space between the first channel nanosheets;

wherein a trimmed second gate spacer comprises the portion of the layer of the spacer material that comprises the second thickness dimension and is along the sidewall of the second gate region;

wherein the second inner spacer comprises a portion of the layer of the spacer material that is within the space between the second channel nanosheets.

10. The method of claim 9, wherein a gate pitch from the first gate region to the second gate region is equal to or less than about 44 nanometers (nm).

11. The method of claim 9, wherein:
the first gate spacer comprises a first gate spacer sidewall; and
the second gate spacer comprises a second gate spacer sidewall.

12. The method of claim 11, wherein:
the first inner spacer comprises a first inner spacer sidewall; and
the second inner spacer comprises a second inner spacer sidewall.

13. The method of claim 12, wherein:
the first gate spacer sidewall is substantially co-planar with the first inner spacer sidewall; and
the second gate spacer sidewall is substantially co-planar with the second inner spacer sidewall.

14. The method of claim 9, wherein the spacer material comprises a low-k material.

15. The method of claim 9, wherein forming the first channel nanosheets to the F-Wf and forming the second channel nanosheets to the S-Wf comprises:
forming first dummy gate spacers over the first channel nanosheet layers; and
forming second dummy gate spacers over the second channel nanosheet layers.

16. The method of claim 15, wherein:
forming the first channel nanosheets to the F-Wf further comprises removing portions of the first channel nanosheet layers that are not covered by the first dummy gates spacers; and
forming the second channel nanosheets to the S-Wf further comprises removing portions of the second channel nanosheet layers that are not covered by the second dummy gates spacers.

17. The method of claim 16, wherein the fabrication operations further comprise removing the first dummy gate spacers prior to conformally depositing the layer of the spacer material to extend along the sidewall of the first gate region, the sidewalls of the first channel nanosheets, and within the space between the first channel nanosheets.

18. The method of claim 17, wherein the fabrication operations further comprise removing the second dummy gate spacers prior to conformally depositing the layer of the spacer material to extend along the sidewall of the second gate region, the sidewalls of the second channel nanosheets, and within the space between the second channel nanosheets.

* * * * *